(12) United States Patent
Kikuchi et al.

(10) Patent No.: US 7,585,699 B2
(45) Date of Patent: Sep. 8, 2009

(54) SEMICONDUCTOR PACKAGE BOARD USING A METAL BASE

(75) Inventors: Katsumi Kikuchi, Tokyo (JP); Tadanori Shimoto, Tokyo (JP); Koji Matsui, Tokyo (JP); Kazuhiro Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 162 days.

(21) Appl. No.: 11/477,111

(22) Filed: Jun. 29, 2006

(65) Prior Publication Data

US 2006/0244137 A1 Nov. 2, 2006

Related U.S. Application Data

(62) Division of application No. 11/002,248, filed on Dec. 3, 2004, which is a division of application No. 09/894,123, filed on Jun. 29, 2001, now Pat. No. 6,841,862.

(30) Foreign Application Priority Data

Jun. 30, 2000 (JP) ............................. 2000-199634

(51) Int. Cl.
- *H01L 21/44* (2006.01)
- *H01L 21/48* (2006.01)
- *H01L 21/50* (2006.01)

(52) U.S. Cl. ................. 438/107; 438/110; 438/116; 257/E23.015; 257/E23.02

(58) Field of Classification Search ................. 438/612, 438/666, 108, 121, 116, 106–107, 110, 118, 438/613, 614, 622; 257/E23.015, E23.02
See application file for complete search history.

(56) References Cited

U.S. PATENT DOCUMENTS

| | | | |
|---|---|---|---|
| 5,977,633 A | 11/1999 | Suzuki et al. | |
| 6,287,890 B1 | 9/2001 | Ho | |
| 6,317,333 B1 | 11/2001 | Baba | |
| 6,418,615 B1 * | 7/2002 | Rokugawa et al. | ............ 29/852 |
| 6,441,314 B2 | 8/2002 | Rokugawa et al. | |
| 2001/0005050 A1 * | 6/2001 | Ohsawa et al. | .............. 257/704 |

FOREIGN PATENT DOCUMENTS

| | | |
|---|---|---|
| JP | H06-334334 | 12/1994 |
| JP | H08-330474 | 12/1996 |
| JP | H09-64493 | 3/1997 |
| JP | 2679681 | 8/1997 |
| JP | H11-17058 | 1/1999 |
| JP | H11-163022 | 6/1999 |
| JP | 11-284100 A | 10/1999 |
| JP | 2000-58701 | 2/2000 |
| JP | 2000-82722 A | 3/2000 |
| JP | 2000-323616 | 11/2000 |
| JP | 2001-144245 A | 5/2001 |
| JP | 2001-185653 A | 7/2001 |
| JP | 2001-352007 A | 12/2001 |

* cited by examiner

*Primary Examiner*—A. Sefer
*Assistant Examiner*—Dilinh P Nguyen
(74) *Attorney, Agent, or Firm*—Sughrue Mion, PLLC

(57) ABSTRACT

A semiconductor package board for mounting thereon a semiconductor chip includes a metal base having an opening for receiving therein the semiconductor chip and a multilayer wiring film layered onto the metal base. The semiconductor chip is flip-chip bonded onto the metal pads disposed on the multilayer wiring film within the opening. The surface of the metal base is flush with the top surface of the semiconductor chip received in the opening. The resultant semiconductor device has a larger number of external pins and a smaller deformation without using a stiffener.

19 Claims, 27 Drawing Sheets

SEMICONDUCTOR PACKAGE BOARD USING A METAL BASE

This is a divisional of application Ser. No. 11/002,248, filed Dec. 3, 2004, which is a divisional of application Ser. No. 09/894,123, filed Jun. 29, 2001 now U.S. Pat. No. 6,841,862, and claims priority from Japanese Patent Application No. 2000-199634, filed Jun. 30, 2000, the entire of which are incorporated herein by reference

BACKGROUND OF THE INVENTION (a) Field of the Invention

The present invention relates to a semiconductor package board using a metal base, a semiconductor device using the semiconductor package, and a manufacturing method thereof. More specifically, the present invention relates to a semiconductor package board having excellent smoothness in a part on which a semiconductor chip is mounted, thereby improving reliability of the semiconductor device, and to a manufacturing method of such semiconductor package board.

(b) Description of the Related Art

Ceramic multilayer wiring boards, each of which mounts thereon a semiconductor chip, for example, enable high-density interconnections to be formed and are widely used. Such ceramic multilayer wiring boards are described in Japanese Patent Laid-open Publication No. Hei. 8-330474. The ceramic multilayer wiring board described in this publication includes an insulating board made of alumina or the like on which a conductor pattern made of a metal having a high melting point such as tungsten or molybdenum is formed. The insulating board is formed with a recess in which a semiconductor chip is received, and the recess is sealed by a covering member.

Japanese Patent Laid-open Publication No. Hei. 11-17058 and Japanese Patent No. 2679681 describe a build-up board or a multi-layered printed circuit board, in which organic resin is used for the insulating material, and a fine-pitch circuit is constructed of copper interconnections formed by etching or plating. A multilayer wiring board which uses organic resin for the insulating material is also considered applicable for multi chip modules (MCM) mounted with a large number of semiconductor chips. The build-up board in which thin films of insulating layers are deposited on a printed circuit board in several layers allows a fine-pitch circuit to be formed on a surface layer, and thus offers advantages for increasing the circuit density.

Japanese Patent Laid-open Publication No. 2000-58701 describes a tape-type board in the form of a chip size package (CSP) and a ball grid array (BGA) including a polyimide film on which copper interconnections are formed.

However, the above-mentioned prior art has the following problems. Ceramic used for the insulating board in the ceramic multilayer wiring board is hard and brittle, and consequently it is apt to chip or crack during fabrication and transfer. Chipping or cracking of the board deteriorates the sealing property of the semiconductor chip rendering it defective, and leads to a decrease in the yield of the ceramic multilayer wiring boards.

Generally, the ceramic multilayer wiring board is fabricated by printing electrically conductive patterns on green sheets followed by stacking them, and then baking the stacked sheets. There is inevitably warpage in the baked board because of the shrinkage caused by baking at a high temperature, resulting in defective products due to deformation or dimensional variations. Such products which do not satisfy the physical requirements cannot provide a high degree of smoothness required for a high-density circuit board or a flip-chip mounting board. That is, physical defects of the board constitute an impediment to a further increase in the number of pins or the density of the circuit and to further miniaturization of the circuit. Poor smoothness in a region where a semiconductor chip is mounted causes cracks or disconnections between the flip-chip mounted semiconductor chip and the board. As a result the reliability of the semiconductor device is lowered.

Build-up boards are apt to warpage because of the mismatches in the coefficient of thermal expansion between the printed circuit board used as a core material and the insulating resin film formed on the board. Such warpage also causes various problems when flip-chip bonding a multi-pinned semiconductor chip impeding further increase in the circuit density. Warpage also decreases the yield of the build-up board.

Tape-type boards made of polyimide have a drawback that position misalignment often occurs because of the expansion of the tape carrier, and therefore it is not suitable for higher density circuit formation.

Moreover, in conventional semiconductor packages, a semiconductor chip is mounted on a multilayer wiring structure film which is formed on a board. Therefore, the region on which the semiconductor chip is mounted is often undulated because of the multi-layered structure, and consequently the connection between the semiconductor chip and the multilayer wiring structure film is unstable.

Furthermore, conventional semiconductor devices require a stiffener for increasing the rigidity of the board. Where, for example, a large heat sink is provided for covering a plurality of semiconductor chips stiffeners are interposed between the board and the heat sink in the gaps between adjacent semiconductor chips. While the board can have a higher rigidity because of the stiffeners, the provision of such stiffeners makes the fabrication process more complex, and increases the production cost of the semiconductor device.

SUMMARY OF THE INVENTION

In view of the above-described problems in the prior art, it is an object of the present invention to provide an improved semiconductor package board with superior smoothness, and a manufacturing method thereof, for providing a highly reliable semiconductor device which enables further miniaturization of high-pin-contact, high-density circuit, and which requires no stiffener.

A semiconductor package board according to the present invention includes: a metal base plate having an opening suited for receiving therein a semiconductor chip; and a multilayer wiring film formed on the metal base plate, the multilayer wiring film having a first surface in contact with the metal base plate and mounting thereon a plurality of first metal pads within a region exposed from the opening of the metal base plate.

According to the semiconductor package board of the present invention, the multilayer wiring film is laminated on the flat metal base, whereby smoothness of the multilayer wiring film is improved. The metal base also serves to reinforce the multilayer wiring film, so as to restrict deformation thereof and to allow circuits to have a higher density and a smaller width with more pins.

A semiconductor device according to the present invention includes the above-described semiconductor package board, and a semiconductor chip received in the opening in the metal base and electrically connected to the first metal pads of the semiconductor package board.

According to the semiconductor device of the present invention, the semiconductor chip is received in the opening formed in the metal base and connected on the top surface of the multilayer wiring film, whereby the reliability of the connection between the semiconductor chip and the multilayer wiring film is improved.

A method for manufacturing a semiconductor package board according to the present invention includes the steps of: forming a plurality of first metal pads on a first surface of a metal base plate; forming a multilayer wiring film including a plurality of insulating layers and a plurality of wiring layers on the first surface of the metal base plate, the multilayer wiring film having a plurality of second metal pads on a top surface thereof, each of the plurality of second metal pads being electrically connected to the respective first metal pads through the wiring layers; and forming an opening in the metal base plate suited for receiving therein a semiconductor chip, the opening exposing the first metal pads.

According to the method of the present invention, the multilayer wiring film is laminated on a planar metal base which serves as a support, after which the opening is formed in the metal base in a region in which the semiconductor chip is to be received. This improves smoothness of the multilayer wiring film, particularly the smoothness of the surface thereof on which the semiconductor chip is mounted.

A method for manufacturing a semiconductor device according to the present invention includes the step of connecting a semiconductor chip to the first metal pads of the semiconductor package board fabricated through the above-described process.

DETAILED DESCRIPTION OF THE PREFERRED EMBODIMENTS

Figure 1A:
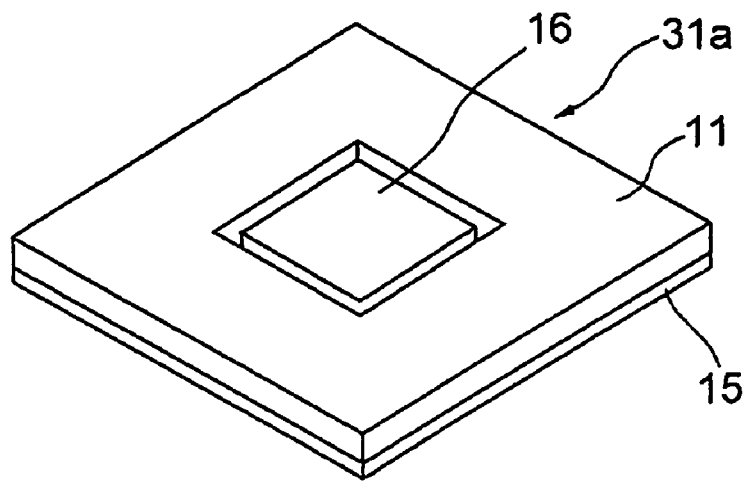
FIGS. 1A to 1C illustrate a semiconductor device according to a first embodiment of the present invention, FIG. 1A being a perspective view showing the front surface thereof, FIG. 1B being a perspective view showing the rear surface thereof, and FIG. 1C being a partial sectional view thereof.

Now, the present invention is more specifically described with reference to accompanying drawings, wherein similar constituent elements are designated by similar reference numerals. First, several embodiments of the semiconductor package and the semiconductor device according to the present invention will be described.

Figure 1B:
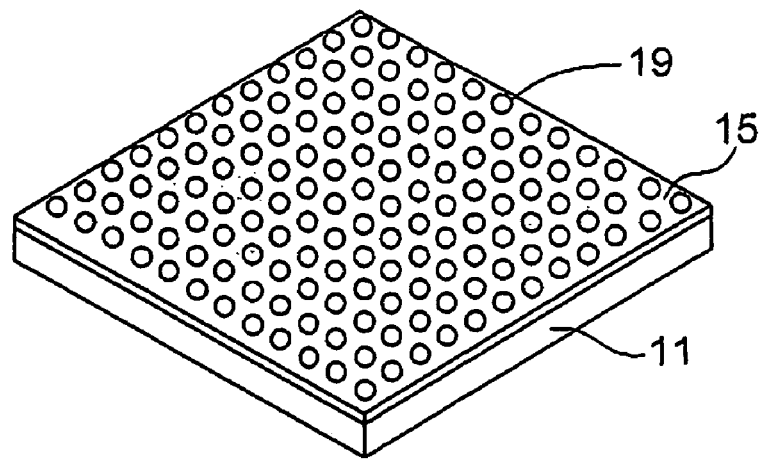
Figure 1C:
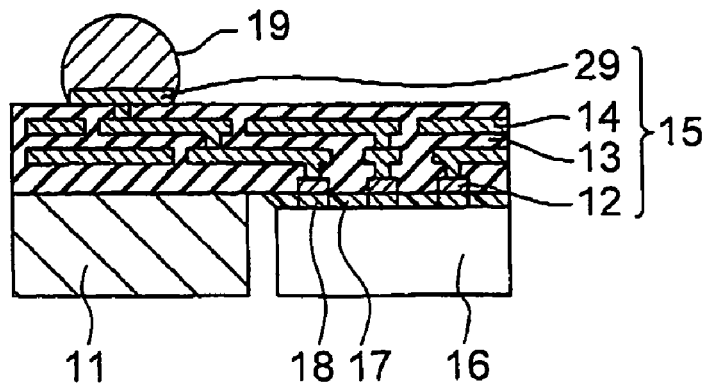

Referring to FIGS. 1A to 1C, a semiconductor device according to a first embodiment of the present invention includes a full-grid ball grid array (BGA) chip 16 mounted on a multilayer wiring film 15 within a central opening of a metal base 11.

The metal base 11 having the central opening and the multilayer wiring film 15 mounted on the metal base 11 in combination constitute a semiconductor package board 31a of the present embodiment. The metal base 11 is formed as a metal plate attached with the multilayer wiring film 15. The opening of the metal base 11 receives therein the semiconductor chip 16, which is mounted on the multilayer wiring film 15. On the rear surface (top surface) of the multilayer wiring film 15 opposite from the front surface thereof where the metal base 11 and the semiconductor chip 16 are arranged, there are provided an array of second metal pads 29, on which an array of solder balls 19 which form a BGA structure are mounted.

On the front surface of the multilayer wiring film 15 on which the metal base 11 and the semiconductor chip 16 are arranged within the central opening of the metal base 11, there are formed a plurality of first metal pads 12 for mounting thereon the semiconductor chip 16. The first metal pads 12 are connected to solder balls 18 formed on the bottom surface of the semiconductor chip 16. The multilayer wiring film 15 includes a plurality of wiring layers 14 each having a predetermined interconnect pattern and insulating resin filling the space of the pattern, and a plurality of insulating layers 13 arranged alternately with the wiring layers 14 and made of organic resin.

The multilayer wiring film 15 is formed on the metal base 11 by using build-up techniques such as subtractive, semi-additive, or full-additive methods. The subtractive method involves etching a copper foil formed on a board or resin for forming a circuit pattern, as, for instance, described in Japanese Patent Laid-open Publication No. Hei. 10-51105. The semi-additive method involves forming a power supply layer or conductive layer, precipitating a metallic layer by electrolytic plating using the conductive layer within a resist pattern, and etching the conductive layer after removing the resist pattern to form a circuit pattern. The semi-additive method is described in Japanese Patent Laid-open Publication No. Hei. 9-64493, for example. The full-additive method involves forming a resist pattern after catalyst seeding the surface of a board or resin, and forming a circuit pattern by electroless plating using the resist as an insulating layer. The full-additive method is described in Japanese Patent Laid-open Publication No. Hei. 6-334334, for example.

The semiconductor chip 16 is fitted into the recess formed by the opening in the metal base 11 on the front surface of the multilayer wiring film 15. Its solder balls 18 are connected to the first metal pads 12 of the multilayer wiring film 15. The gaps between the solder balls 18 in the space between the semiconductor chip 16 and the multilayer wiring film 15 are filled with under-filling layer 17.

The BGA solder balls 19 are connected to the second metal pads 29, which are connected to the uppermost layer of the wiring layers 14. The wiring layers 14 are each connected through the via holes formed in the insulating layers 13, and the lowest layer of the wiring layers 14 is also connected to the first metal pads 12 through the via holes. The first metal pads 12 are connected to the semiconductor chip 16 through the solder balls 18.

The metal base 11 may be composed of at least one metal which is selected from the group consisting of stainless steel, iron, nickel, copper, and aluminum, or an alloy thereof. Stainless steel and copper alloy are the most preferable in terms of feasibility of handling. The metal base 11 has a preferred thickness in the range of 0.1 to 1.5 mm.

The surface of the first metal pads 12 on which the solder balls 18 are connected for mounting the semiconductor chip 16 may be preferably implemented by a metal such as gold, tin, solder, or an alloy thereof. In the preferred embodiment, the surfaces of the metal pads 12 are composed of gold. In the example illustrated in FIG. 1C, the contact surfaces between the metal pads 12 and the solder balls 18 are coplanar with the surface of the multilayer wiring film 15. Alternatively, the surface of the metal pads 12 may be recessed from the surface of the multilayer wiring film 15 to securely hold the solder balls 18 therein by allowing the formed recess to function as a dam for the solder ball 18.

The insulating layers 13 are made of either one or more types of organic resin selected from the group consisting of an epoxy resin, an epoxy acrylate resin, an urethane acrylate resin, a polyester resin, a phenol resin, a polyimide resin, a benzocyclobutene (BCB), and a polybenzoxazole (PBO). One of the organic resins may be used for all of the insulating layers 13 interposed between the wiring layers 14. Alternatively, insulating layers 13 using two or more of the organic resins may be mixed, and interposed between the wiring layers 14. For example, as in the preferred embodiment, polyimide resin alone may be used for all of the insulating layers 13, or while the lowest insulating layer 13 is made of polyimide resin, the other layers may be formed of epoxy resin.

The wiring layers 14 are preferably made of copper due to its low cost as in this preferred embodiment. However, other types of metal selected from the group consisting of gold, silver, aluminum, and nickel, or an alloy thereof, are also appropriate.

The semiconductor device according to the first embodiment of the present invention, as described above, includes the semiconductor package board 31a and the semiconductor chip 16 mounted thereon, and is assembled as follows. The semiconductor chip 16 is flip-chip bonded for connecting its solder balls 18 to the respective metal pads 12. The space between the semiconductor chip 16 and the multilayer wiring film 15 is filled by underfill 17, which is cured after the introduction thereof. The BGA solder balls 19 are then mounted onto the metal pads 29 of the multilayer wiring film 15 and thus the semiconductor device shown in FIG. 1A is obtained. The drawing shows an example in which the semiconductor chip 16 is flip-chip bonded via the solder balls 18 connected to the metal pads 12. However, semiconductor chip 16 may be mounted on the surface of the multilayer wiring film 15 with its face upward, and electrically connected to the multilayer wiring film 15 by any suitable means such as wire bonding or the like.

Since the above described semiconductor package board has its multilayer wiring film 15 layered upon the metal base 11, the smoothness of the multilayer wiring film 15 which is achieved is excellent. The semiconductor chip 16 is received within the opening formed in the metal base 11 and connected on the uppermost surface of the planar, warp-free multilayer wiring film 15. In this way a stable and highly reliable connection between the semiconductor chip 16 and the multilayer wiring film 15 is achieved.

Moreover, the top surface of the semiconductor chip 16 on the side on which it is not connected to the multilayer wiring film 15 is coplanar with the surface of the metal base 11 on the front surface on which it is not bonded to the multilayer wiring film 15. Thereby, the metal base 11 also functions as a stiffener for restricting displacement of the multilayer wiring film 15 in a vertical direction and for enhancing its resistance to buckling. The top surface of the semiconductor chip 16 and the front surface of the metal base 11 are not necessarily coplanar with each other, in which case the metal base 11 can also be used as a frame for preventing deformation of the multilayer wiring film 15. Furthermore, the metal base 11 can function as a topmost ground layer due to its conductivity.

Figure 2:
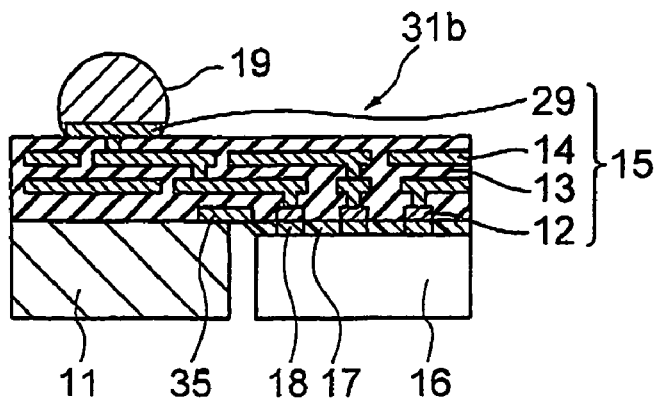
FIG. 2 is a partial sectional view showing a semiconductor device according to a second embodiment of the present invention.

Next, a semiconductor package board or a semiconductor device according to a second embodiment of the present invention will be described. FIG. 2 is a partial sectional view showing the structure of the semiconductor device using the semiconductor package board according to the present embodiment. The characteristic feature of the semiconductor package board according to the present embodiment is that a metallic film 35 is formed on the multilayer wiring film 15 at the periphery of the central opening of the metal base 11.

In the semiconductor device of the present embodiment, the semiconductor chip 16 is mounted on the semiconductor package board 31b within the central opening of the metal base 11. This structure is formed as follows. Specifically, the semiconductor chip 16 is disposed within the central opening of the metal base 11, and subjected to flip-chip bonding to the metal pads 12 disposed within the central opening by using solder balls 18. Subsequently, the under-fill (or underfilling layer) 17 is formed in the space between the semiconductor chip 16 and the multilayer wiring film 15 by filling fluid underfill and subsequent solidification thereof. Thereafter, the BGA solder balls 19 are mounted on the metal pads 29 of the multilayer wiring film 15, thereby achieving the structure of the semiconductor device of FIG. 2. Alternatively, the connection between the semiconductor chip 16 and the multilayer wiring film 15 may be implemented by a wire bonding technique, as in the case of the first embodiment.

In the structure of the second embodiment, the metal film 35 formed on the multilayer wiring film 15 at the periphery of the opening of the metal base 11 alleviates the stress applied to the multilayer wiring film 15, the stress being generated due to the presence of the metal base on which the multilayer wiring film 15 is formed. This suppresses generation of cracks in the multilayer wiring film 15.

Figure 3:
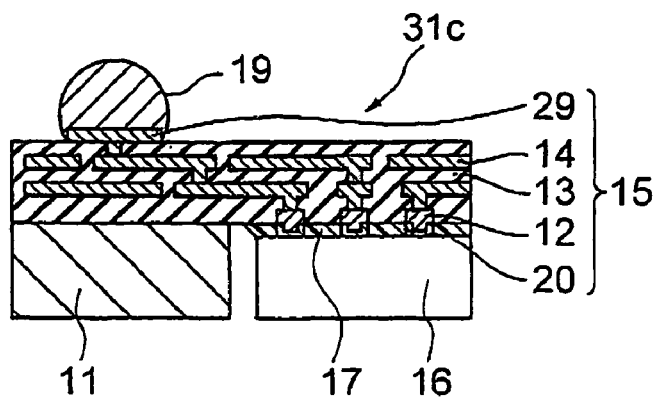
FIG. 3 is a partial sectional view showing a semiconductor device according to a third embodiment of the present invention.

Next, a semiconductor package board according to a third embodiment of the present invention will be described. FIG. 3 is a partial sectional view showing the structure of the semiconductor device using the semiconductor package board according to the present embodiment. The characteristic feature of the semiconductor package board according to the present embodiment is that solder balls 20 are provided on the surface of the metal pads 12 so as to protrude from the surface of the multilayer interconnection film 15.

The semiconductor device according to the third embodiment of the present invention includes a semiconductor package board 31c and a semiconductor chip 16 mounted thereon, and is assembled as follows. The semiconductor chip 16 is flip-chip bonded through solder balls 20 to the metal pads 12 arranged within the opening in the metal base 11. The semiconductor chip 16 may have the solder balls 18, in which case it is connected to the metal pads 12 through both the solder balls 18 and 20. The space between the semiconductor chip 16 and the multilayer wiring film 15 is filled by underfilling liquid 17, and the underfilling liquid 17 is cured. The BGA solder balls 19 are then mounted onto the metal pads 29 of the multilayer wiring film 15 and thus the semiconductor device shown in FIG. 2 is obtained. Similarly to the first embodiment, the semiconductor chip 16 may be mounted on the multilayer wiring film 15 by wire bonding or the like.

According to the semiconductor device of the present embodiment, solder balls 20 are provided which can function as the main or supplemental solder to flip-chip bond the semiconductor chip 16 to the multilayer wiring film 15, thereby enabling the flip chip pads to be formed at a fine-pitch. Also, the solder balls 18 of the semiconductor chip 16 can be dispensed with. Apart from the solder balls 20, the structure of the semiconductor device according to the present embodiment is similarly to that of the above-described first or second embodiment.

Figure 4:
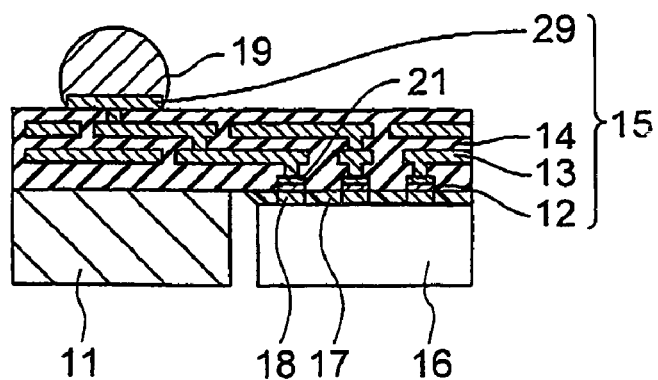
FIG. 4 is a partial sectional view showing a semiconductor device according to a fourth embodiment of the present invention.
Figure 5:
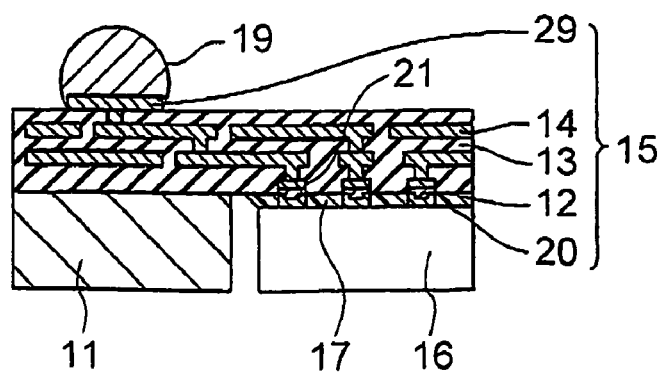
FIG. 5 is a partial sectional view showing a semiconductor device according to a fourth embodiment of the present invention.

Next, a semiconductor package board or a semiconductor device according to a fourth embodiment of the present invention will be described. FIG. 4 and FIG. 5 are partial sectional views showing the structure of the semiconductor device using the semiconductor package board according to the present embodiment. The characteristic feature of the semiconductor package board according to the present embodiment is that thin-film capacitors 21 are mounted on the metal pads 12.

The thin-film capacitors 21 are formed by any suitable techniques such as sputtering, evaporation, CVD, or the anodic oxidation method. They are preferably composed of a compound material having a perovskite structure such as titanium oxide, tantalum oxide, $Al_2O_3$, $SiO_2$, $Nb_2O_5$, BST $(Ba_xSr_{1-x}TiO_3)$, PZT $(PbZr_xTi_{1-x}O_3)$, PLZT $(Pb_{1-y} La_yZr_x Ti_{1-x}O_3)$, and $SrBi_2Ta_2O_9$, where $0 \leq x \leq 1$, $0 < y < 1$. Alternatively, the thin-film capacitors 21 may be composed of organic resin or the like with which a desired dielectric constant can be achieved.

Due to such thin-film capacitors 21 provided on the metal pads 12, decoupling capacitors can be placed in close proximity to the semiconductor chip 16 in the semiconductor device according to the fourth embodiment. Similarly to the third embodiment, the semiconductor device may also have solder balls 20 on the surface of the metal pads 12 as shown in FIG. 5. Similarly to the first through third embodiments, the semiconductor chip 16 may be mounted on the multilayer wiring film 15 by wire bonding or the like. Apart from the thin-film capacitors 21, the structure of the semiconductor device according to the present embodiment is similar to that of the above-described first through third embodiments.

Figure 6A:
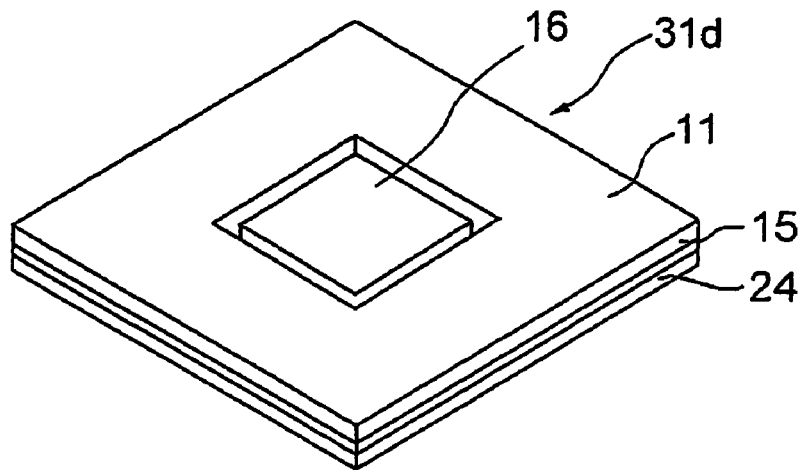
FIGS. 6A to 6C illustrate a semiconductor device according to a fifth embodiment of the present invention, FIG. 5A being a perspective view showing the front surface thereof, FIG. 5B being a perspective view showing the rear surface thereof, and FIG. 5C being a partial sectional view thereof.
Figure 6B:
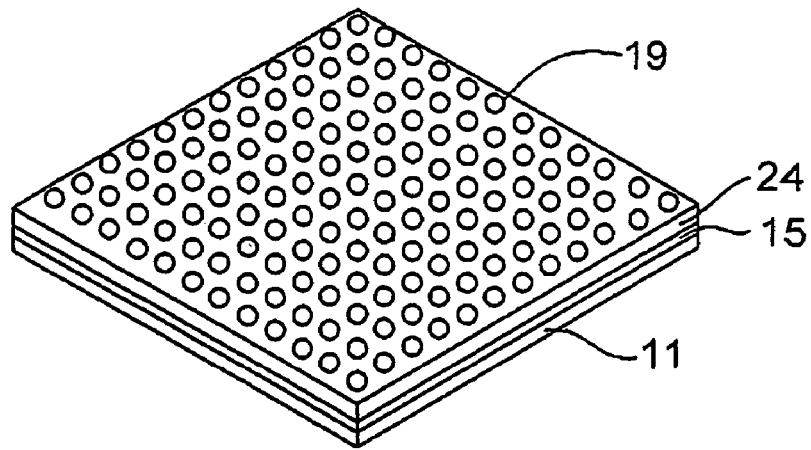
Figure 6C:
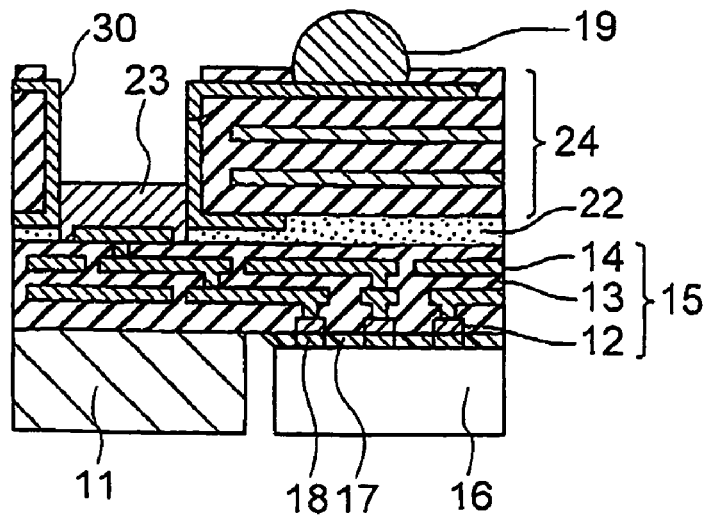

Next, a semiconductor package board (or a semiconductor device) according to a fifth embodiment of the present invention will be described. FIGS. 6A to 6C illustrate a semiconductor package board or a semiconductor device according to the present embodiment of the present invention. FIG. 6A is a perspective view showing the semiconductor device viewed from the front surface. FIG. 6B is a perspective view illustrating the rear surface of the semiconductor device, and FIG. 6C is a partial sectional view of the semiconductor device. The semiconductor device shown in FIGS. 6A through 6C employs a printed circuit board 24 as a carrier base.

The characteristic feature of the semiconductor package board 31c of the fifth embodiment shown in FIGS. 6A through 6C is that the semiconductor package boards 31a, 31b or 31b according to the first through third embodiments are provided with the printed circuit board 24 employed as a carrier base. Electrical connection between the package boards 31a or 31b and the printed circuit board 24 is achieved by an anisotropic conductive film or conductive paste 23. For such a carrier base, a printed circuit board composed of more than one layer, a ceramic board, or an organic/inorganic composite board such as, for example, GVP (Grid Via Plate) made by NGK Insulators, LTD, may be used.

The carrier base may be bonded to the semiconductor package board by any suitable means such as an adhesive, thermo-compressive bonding, or chemical reaction. The electrical connection is achieved by the anisotropic conductive film or conductive paste 23 in a desired pattern. In the example illustrated in FIGS. 6A through 6C, a printed circuit board 24 is used for the carrier base, and the printed circuit board 24 is electrically connected to the multilayer wiring film 15 via the conductive paste 23 and the metal pads 29 through the through-holes 30 in the printed circuit board 24. Electrical connection between the printed circuit board 24 and the multilayer wiring film 15 is not necessarily be effected via the through-holes 30, and instead, the printed circuit board 24 may have connection pads on its surface for such purpose. Alternatively, the through-holes 30 in the printed circuit board 24 may be filled with insulating resin, and metal pads may be formed on the surface of this insulating resin for the electrical connection. Further, the through-holes 30 may be filled with a paste containing metal particles. The conductive paste 23 shown in FIG. 6C may be sealed by covering the conductive paste 23 with insulating resin.

The semiconductor device according to the fifth embodiment is composed of the semiconductor package board 31c and a semiconductor chip 16 mounted thereon, and is assembled as follows. The printed circuit board 24 is bonded by an adhesive 22 to a semiconductor package board 31a, 31b or 31c of the above described first through fourth embodiments. In this way the electrical connection is achieved in the desired positions, thereby obtaining the semiconductor package board 31c as shown in FIGS. 6A to 6C. The semiconductor chip 16 is flip-chip bonded so as to be electrically connected to the metal pads 12 of the semiconductor package board 31c. Electrical connection of the semiconductor chip 16 with the semiconductor package board 31c may be achieved through the above mentioned solder balls 20 if such are formed on the metal pads 12, or alternatively through the solder balls 18 in the absence of the solder balls 20. Or alternatively, both of the solder balls 18 and 20 may be used for connecting the semiconductor chip 16 to the metal pads 12. Then, the space between the semiconductor chip 16 and the multilayer wiring film 15 is filled by underfill 17, and the underfill 17 is cured. The BGA solder balls 19 are mounted onto the pads on the surface of the printed circuit board 24. Similarly to the first through third embodiments, the semiconductor chip 16 may be mounted on the multilayer wiring film 15 by wire bonding or the like.

The semiconductor package board 31d or the semiconductor device of the fifth embodiment structured as described above has the enhanced function of a ground layer because of the provision of a printed circuit board 24 as a carrier base. The semiconductor package board 31c can be readily provided with additional functions by incorporating passive components such as resistors or capacitors within the printed circuit board 24. The printed circuit board 24 also helps alleviate the stress generated in the secondary mounting operation, thereby improving reliability of the semiconductor device.

Figure 7:
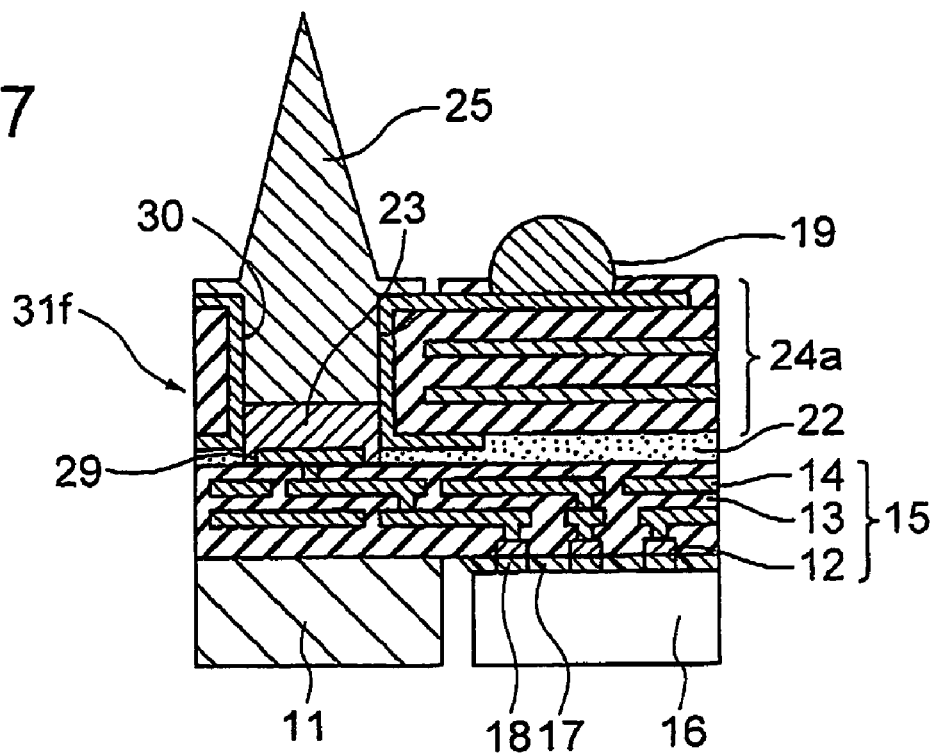
FIG. 7 is a partial sectional view showing a semiconductor device according to a sixth embodiment of the present invention.

Next, a semiconductor package board or a semiconductor device according to a sixth embodiment of the present invention will be described. FIG. 7 is a partial sectional view showing the structure of the semiconductor device according to the sixth embodiment of the present invention.

As shown in FIG. 7, the characteristic feature of the semiconductor package board 31f of the sixth embodiment is that the semiconductor package boards 31a, 31b or 31c according to the first through fourth embodiments are provided with a printed circuit board 24a as a carrier base. Electrical connection between the semiconductor package boards 31a, 31b or 31c and printed circuit board 24a is achieved by an anisotropic conductive film or conductive paste 23. Additionally, the through-holes 30 in the printed circuit board 24a are fitted with connector pins 25.

Similarly to the above-described fifth embodiment, the carrier base may be bonded to the semiconductor package board by any suitable means such as an adhesive, thermocompressive bonding, or chemical reaction. The electrical connection is achieved by an anisotropic conductive film or conductive paste 23 in a desired pattern. In the example illustrated in FIG. 7, a printed circuit board 24a is used for the carrier base, and the through-holes 30 of the printed circuit board 24a are fitted with connector pins 25 for achieving electrical connection to the outside. The connector pins 25 do not need to be positioned exactly above the metal pads 29 through which the printed circuit board 24a is connected to the multilayer wiring film 15.

The semiconductor device according to the sixth embodiment is composed of the semiconductor package board 31f and a semiconductor chip 16 mounted thereon, and is assembled as follows. The printed circuit board 24a is bonded by an adhesive 22 to a semiconductor package board 31a, 31b or 31c of the above-described first through fourth embodiments. In this way, the electrical connection is achieved in the desired positions, thereby obtaining the semiconductor package board 31f as shown in FIG. 7. The semiconductor chip 16 is flip-chip bonded so as to be electrically connected to the metal pads 12 of the semiconductor package board 31f. Then, the space between the semiconductor chip 16 and the multilayer wiring film 15 is filled by underfill 17, and the underfill 17 is cured. The connector pins 25 are mounted onto the through-holes 30 of the printed circuit board 24a. Similarly to the first through fourth embodiments, the semiconductor chip 16 may be mounted on the multilayer wiring film 15 by wire bonding or the like.

The semiconductor package board 31g or the semiconductor device of the sixth embodiment structured as described above has the enhanced function of a ground layer, similarly to the fifth embodiment, due to the provision of a printed circuit board 24a as a carrier base. The semiconductor package board 31f can be readily provided with additional functions by incorporating passive components such as resistors or capacitors within the printed circuit board 24a. The printed circuit board 24a also helps alleviate the stress generated in the secondary mounting operation, thereby improving reliability of the semiconductor device. Furthermore, connector pins 25 can be securely attached to the printed circuit board 24a by using its via-holes.

Next, a semiconductor package board or a semiconductor device according to a seventh embodiment of the present invention will be described. FIG. 7 is a partial sectional view showing the structure of the semiconductor device according to the sixth embodiment of the present invention.

Figure 8:
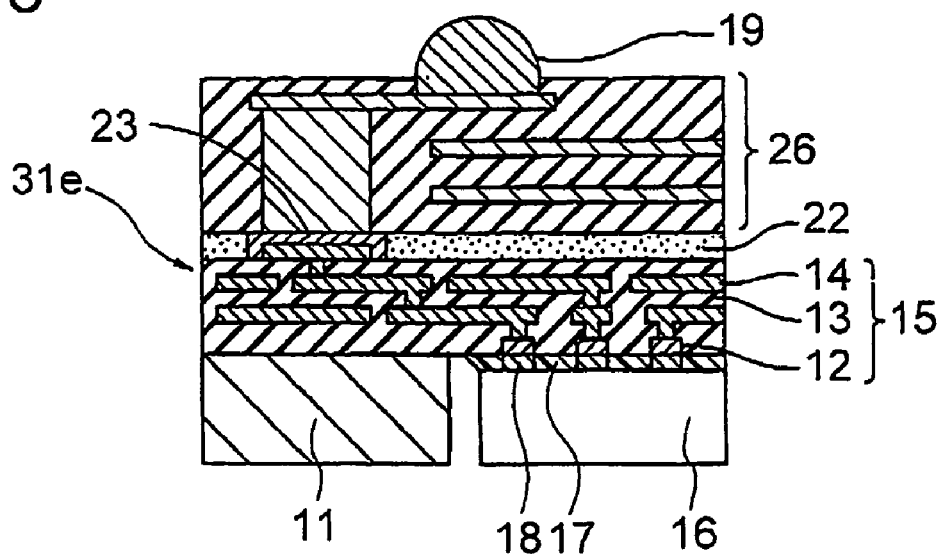
FIG. 8 is a partial sectional view showing a semiconductor device according to a seventh embodiment of the present invention.

As shown in FIG. 8, the characteristic feature of the semiconductor package board 31e of the seventh embodiment is that is the semiconductor package board 31a, 31b or 31c according to the first through fourth embodiments are provided with a ceramic board 26 as a carrier base.

The semiconductor device according to the seventh embodiment is composed of the semiconductor package board 31e and, a semiconductor chip 16 mounted thereon, and is assembled as follows. The ceramic board 26 is bonded by an adhesive 22 to a semiconductor package board 31a, 31b or 31c of the above described first through fourth embodiments, such that electrical connection is achieved in the desired positions. The semiconductor package board 31e is thereby obtained, as shown in FIG. 8. The semiconductor chip 16 is flip-chip bonded so as to be electrically connected to the metal pads 12 of the semiconductor package board 31d. Then, the space between the semiconductor chip 16 and the multilayer wiring film 15 is filled with underfill 17, and the underfill 17 is cured. The BGA solder balls 19 are mounted on corresponding pads provided in the ceramic board 26. The BGA solder balls 19 may be located just above the via holes. Similarly to the first through fourth embodiments, the semiconductor chip 16 may be mounted on the multilayer wiring film 15 by wire bonding or the like.

The semiconductor package board 31e or the semiconductor device of the sixth embodiment structured as described above has the enhanced function of a ground layer due to the provision of a ceramic board 26 as a carrier base. The semiconductor package board 31e can be readily provided with additional functions by incorporating passive components such as resistors or capacitors within the ceramic board 26. The ceramic board 26 also helps alleviate the stress generated in the secondary mounting operation, thus improving reliability of the semiconductor device.

Next, several examples of the method for fabricating a semiconductor device according to the present invention will be described. FIGS. 9A through 9I are partial sectional views illustrating a semiconductor device fabricating method according to a first example of the method of the present invention. The views are in the same order as the process steps. The method of the present embodiment is used for fabricating the semiconductor device according to the first embodiment of the present invention shown in FIGS. 1A to 1C. Although not illustrated, cleaning and thermal processing are performed as required after the process step prior to the next step.

Figure 9A:
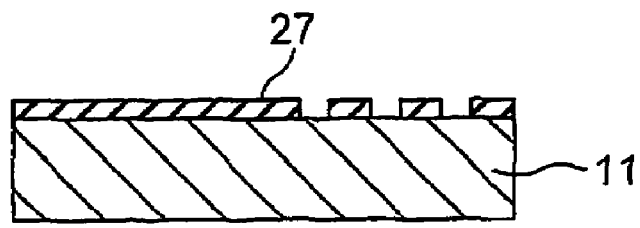
FIGS. 9A to 9I are partial sectional views consecutively showing steps of a process for fabricating a semiconductor device according to a first example of the method of the present invention.

First, a resist plate 27 is formed on the surface of the metal base 11 made of a metal plate having a thickness in a range of 0.1 to 1.5 mm as shown in FIG. 9A. A fluid resist plate 27 may be provided by any technique such as spin coating, die coating, curtain coating, or printing. If the resist plate 27 is made of a dry film, it can be formed on the metal base 11 by a laminating method or the like. Thereafter, the resist plate 27 is cured by a drying treatment or the like. A predetermined pattern is then formed in the resist plate 27 by a photolithographic process or the like. If the resist plate 27 is not photosensitive, such a pattern may be formed by a laser processing method or the like.

Figure 9B:
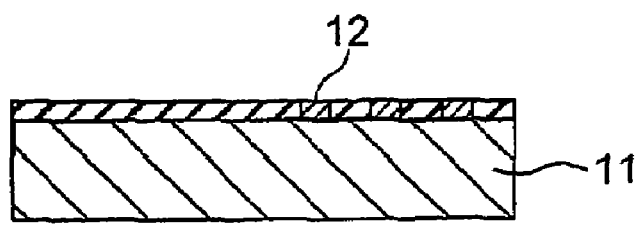

Next, as shown in FIG. 9B, at least one metal which is selected from the group consisting of gold, tin, and solder, or an alloy thereof is precipitated in the openings in the resist plate 27. This is achieved by electrolytic plating or electroless plating so as to form the surface layers of the first metal pads 12. Nickel as a barrier metal (not shown) and copper are consecutively precipitated to complete the first metal pads 12. A barrier metal such as nickel may also be precipitated in the openings in the resist plate 27 prior to the formation of the surface layers of the metal pads 12. This is achieved in order to prevent an intermetallic compound from being formed between the metal base 11 and the surface layers of the metal pads 12. Such a barrier metal should preferably be made of a metal which allows itself to be readily removed by etching. If the surface of the metal pads 12 is desired to be retracted from the surface of the multilayer wiring film 15 in successive process steps shown in FIGS. 9A to 9D, metal such as nickel which is removable by etching is first precipitated to a predetermined thickness. This is followed by the precipitation of metals constituting the surface layers of the metal pads 12, nickel as a barrier metal, and copper to complete the metal pads 12.

Figure 9C:

Then, the resist plate 27 is removed as shown in FIG. 9C, and the surface of the metal base 11 with the metal pads 12 is thoroughly cleaned.

Figure 9D:
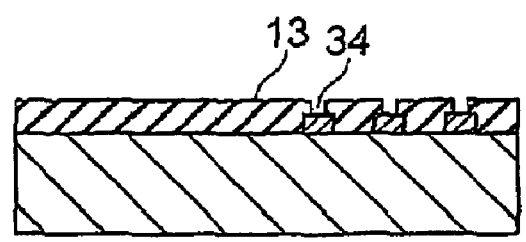

Next, the insulating layer 13 is formed as shown in FIG. 9D. Fluid insulating resin may be deposited by any of the spin coating, die coating, curtain coating, or printing methods. Alternatively, a dry film of insulating resin may be formed on the metal base 11 by a laminating method or the like. After that, the insulating resin is cured by drying treatment or the like. Predetermined patterns including the through holes 34 are then formed either by a photolithographic process or a laser processing method depending on whether the insulating resin is photosensitive or not. Finally, the insulating resin is cured to complete the insulating layer 13.

Next, the wiring layer 14 including a pattern of electrically conductive material is formed by any of the subtractive, semi-additive, or full-additive techniques. The through holes 34 are filled with a conductive material for connecting the wiring layer 14 to the metal pads 12.

Figure 9E:
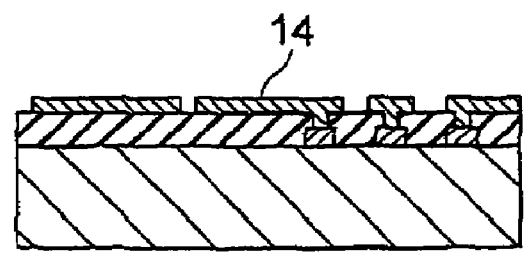
Figure 9F:
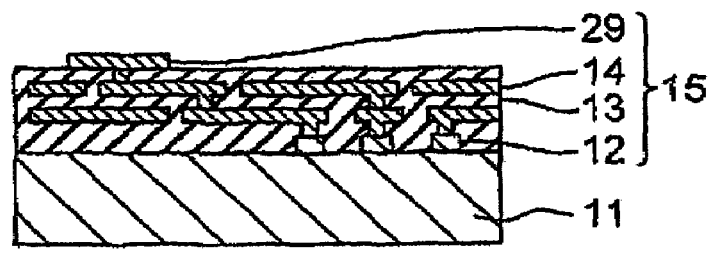

The process steps for forming the insulating layer 13 and the wiring layer 14 using any of the subtractive, semi-additive, or full-additive techniques are repeated for forming the multilayer wiring film 15 as shown in FIG. 9F.

Figure 9G:
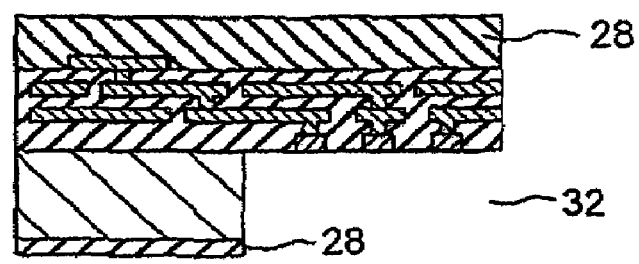

Next, an etching resist 28 is formed on the rear surface of the multilayer wiring film 15 and on the front surface of the metal base 11 as shown in FIG. 9G. The etching resist may be deposited by any method such as spin coating, die coating, curtain coating, or printing if it is fluid, or by a laminating method if it is made of a dry film. Thereafter, the etching resist 28 is cured by a drying treatment or the like, and a predetermined pattern is formed therein either by a photolithographic process or a laser processing method depending on whether the etching resist 28 is photosensitive or not. The metal base 11 is then etched, using the etching resist 28 as a mask, until the multilayer wiring film 15 is exposed so as to form a recess 32.

Figure 9H:
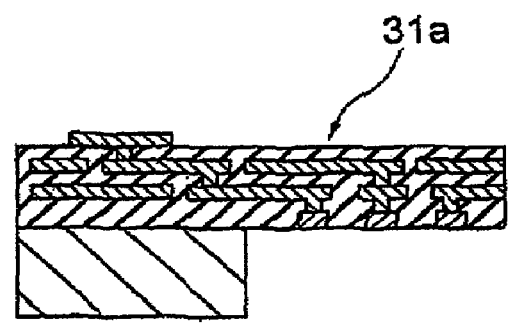

The etching resist 28 is then removed as shown in FIG. 9H, and the surface of the metal pads 12 and the surface of the metal pads 29 are thoroughly cleaned. Thus the semiconductor package board 31a is obtained.

Figure 9I:
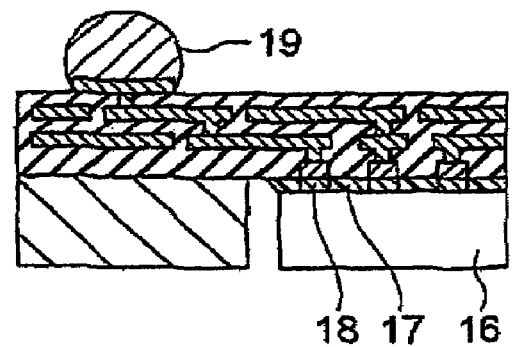

Next, the semiconductor chip 16 is flip-chip bonded to the metal pads 12 through the solder balls 18 as shown in FIG. 9I, after which the space between the multilayer wiring film 15 and the semiconductor chip 16 is filled with underfill 17, and the underfill 17 is cured.

Finally, the BGA solder balls 19 are mounted onto the metal pads 29, thereby completing the semiconductor device as shown in FIG. 9D.

Thus the semiconductor devices according to the first embodiment of the present invention previously described are efficiently manufactured by the above described fabrication process. According to the first example of the method of the present invention, the multilayer wiring film 15 is laminated on the planar metal base 11 which serves as a support, whereby the smoothness of the multilayer wiring film 15, particularly of its front surface, on which the semiconductor chip 16 is connected, is improved.

Next, a semiconductor device fabrication process according to a second example of the method of the present invention will be described. The method according to the second example is used for manufacturing the semiconductor device according to the second embodiment of the present invention previously described, and shown in FIG. 2. The characteristic feature of the present example is, compared to the method according to the first example, that it has an additional process step for forming a metallic film 35. FIGS. 10A through 10K are partial sectional views illustrating a semiconductor device fabrication process according to the second example of the method of the present invention. The views are arranged in the same order as the process steps. Although not illustrated, cleaning and thermal processing are performed as required after a process step prior to the next step.

Figure 10A:
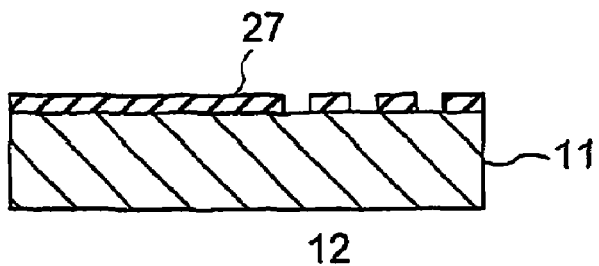
FIGS. 10A to 10K are partial sectional views consecutively showing steps of a process for fabricating a semiconductor device according to a second example of the method of the present invention.

First, a resist plate 27 is formed on the surface of the metal base 11 composed of a metal plate having a thickness in a range of 0.1 to 1.5 mm as shown in FIG. 10A. The resist plate 27 may be formed by any technique such as spin coating, die coating, curtain coating, or printing, if it is fluid. Alternatively, resist plate 27 made of a dry film can be formed on the metal base 11 by a laminating method or the like. Thereafter, the resist plate 27 is cured by drying treatment or the like. A predetermined pattern is then formed in the resist plate 27 by a photolithographic process or the like. If the resist plate 27 is not photosensitive, such a pattern may be formed by a laser processing method or the like.

Figure 10B:
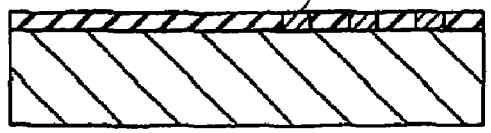

Next, as shown in FIG. 10B, a metal selected from the group consisting of gold, tin and solder or an alloy thereof is precipitated in the openings in the resist plate 27 by electrolytic plating or electroless plating to form a surface layers of the first metal pads 12, after which nickel as barrier metal (not shown) and copper are consecutively precipitated to form the first metal pads 12. A barrier metal such as nickel may also be precipitated in the openings in the resist plate 27 prior to the formation of the surface layers of the metal pads 12. This is conducted in order to prevent an intermetallic compound from being formed between the metal base 11 and the solder balls 20. Such a barrier metal should preferably be made of a metal which allows itself to be readily removed by etching.

In addition, if the surface of the metal pads 12 should be retracted from the surface of the multilayer wiring film 15, the metal constituting the metal pads 12 is precipitated after precipitation of nickel, for example, which is readily removed by etching, to a specified thickness, then nickel is precipitated as a barrier metal, and copper is finally precipitated to form a final structure of the metal pads 12.

Figure 10C:
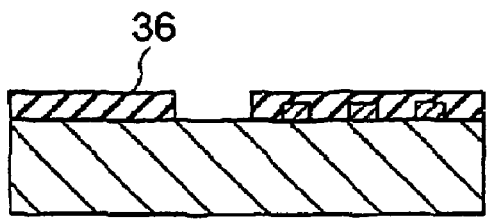

Thereafter, as shown in FIG. 10C, a resist plate 36 is formed. In this step, it is generally preferable that the resist plate 36 is formed after the resist plate 27 is removed. Alternatively, the resist plate 36 may be formed on the resist plate 27, followed by patterning of the resist plate 36 together with the resist plate 27. The resist plate 36 may be formed by any technique such as spin coating, die coating, curtain coating, or printing, if it is fluid. Alternatively, a resist plate 36 made of a dry film can be formed by a laminating method or the like. Thereafter, the resist plate 36 is cured by drying treatment or the like. A predetermined pattern is then formed in the resist plate 36 by a photolithographic process or the like. If the resist plate 36 is not photosensitive, such a pattern may be formed by a laser processing method or the like.

Figure 10D:
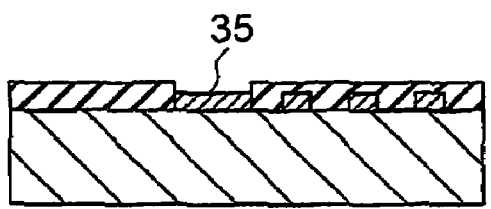

Next, as shown in FIG. 10D, at least one metal which is selected from the group consisting of gold, platinum, silver, palladium, titanium, chrome, molybdenum, tantalum, nickel and aluminum, or an alloy thereof, which have a large resistance against the etching for the metal base 11, is precipitated in the openings in the resist plate 36. This is achieved by electrolytic plating or electroless plating so as to form a surface layer for a metallic film 35. Next, the metallic film 35 is formed by precipitating copper, nickel or palladium using electrolytic plating or electroless plating, for obtaining a desired thickness of the metallic film 35. If it is desired that the metallic film have an additional electric property, a barrier metal not shown may be formed for suppressing intermetallic diffusion. In this case, if it is considered that an intermetallic compound is formed between the metal in the metal base 11 and the metal constituting the surface layer of the metallic film 35, a nickel barrier metal is formed prior to the formation of the surface layer of the metal pads 12. This barrier metal is preferably made of a metal that is readily removed by etching. In addition, if the surface of the metallic film 35 is to be retraced from the surface of the multilayer wiring film 15 in the later steps, the metallic film 35 should be formed after precipitation of a metal, such as nickel which is readily removed by etching, to a desired thickness. Conversely, if the metallic film 35 should protrude from the multilayer wiring film 15, a recess is formed by etching using a resist plate 36 as a mask before forming the metallic film 35.

Figure 10E:

Then, the resist plate 27 is removed as shown in FIG. 10E, and the surface of the metal base 11 is thoroughly cleaned.

Figure 10F:
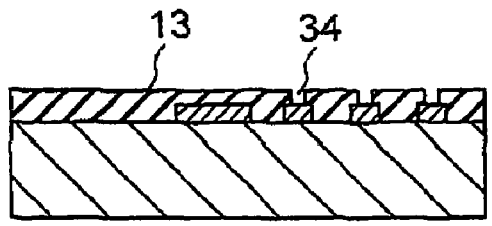

Next, an insulating layer 13 is formed as shown in FIG. 10F. Fluid insulating resin for the insulating layer 13 may be deposited by any of the spin coating, die coating, curtain coating, or printing methods. Alternatively, a dry film of insulating resin may be formed on the metal base 11 by a laminating method or the like. Thereafter, the insulating resin is cured by a drying treatment or the like. Predetermined patterns including the via holes 34 are then formed either by a photolithographic process or a laser processing method depending on whether the insulating resin is photosensitive or not. Finally, the insulating resin is cured to complete the insulating layer 13.

Figure 10G:
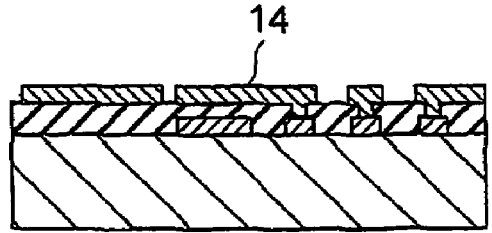

Next, the wiring layer 14 including a pattern of electrically conductive material is formed by any of the subtractive, semi-additive, or full-additive techniques as shown in FIG. 10G. Via holes 34 are filled with a conductive material for connecting the wiring layer 14 to the metal pads 12. If the metallic film 35 is to be used as an electric component in the electric circuit, via holes are formed at desired positions at the step of FIG. 10F, followed by connecting the wiring layer 14 and the metallic film 35 together in the step of FIG. 10G.

Figure 10H:
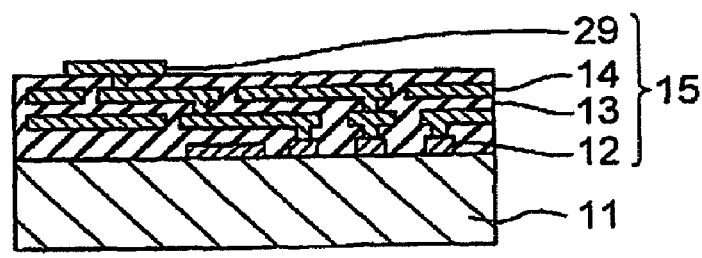
Figure 10:
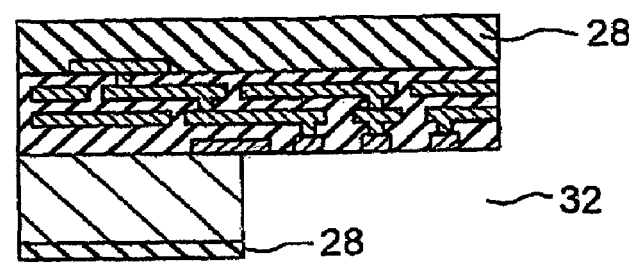

Next, the process steps for forming the insulating layer 13 and the wiring layer 14 using any of the subtractive, semi-additive, or full-additive techniques are repeated for forming the multilayer wiring film 15, as shown in FIG. 10H.

Next, an etching resist 28 is formed on the rear surface of the multilayer wiring film 15 and on the front surface of the metal base 11 as shown in FIG. 10I. The etching resist 28 may be deposited by any of the spin coating, die coating, curtain coating, or printing methods if it is fluid, or by a laminating method if it is made of a dry film. Thereafter, the etching resist 28 is cured by a drying treatment or the like, and a predetermined pattern is formed therein either by a photolithographic process or a laser processing method depending on whether the etching resist 28 is photosensitive or not. The metal base 11 is then etched, using the etching resist 28 as a mask, until the multilayer wiring film 15 is exposed so as to form a recess 32.

Figure 10J:
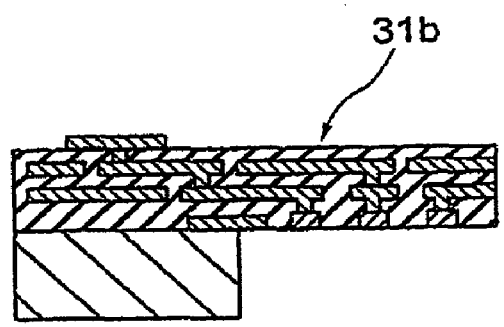

The etching resist 28 is then removed as shown in FIG. 10J, and the surface of the metal pads 12 and the surface of the metal pads 29 are thoroughly cleaned. Thus, the semiconductor package board 31*b* is obtained.

Figure 10K:
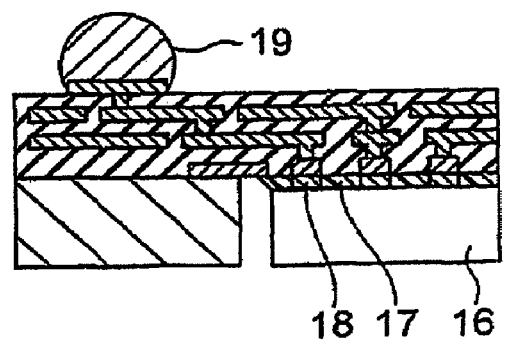

Next, as shown in FIG. 10K, the semiconductor chip 16 is flip-chip bonded to the metal pads 12 through the solder balls 20, followed by filling the space between the multilayer wiring film 15 and the semiconductor chip 16 with underfill 17 and curing thereof.

Finally, the BGA solder balls 19 are mounted on the metal pads 29, thereby completing the semiconductor device as shown in FIG. 10K.

In an alternative for the present example, after iterating the steps of FIGS. 11A through 11E, the process may advance to the steps beginning with the step of FIG. 10H to form the metallic pads and the metallic film 35 concurrently.

Figure 11A:
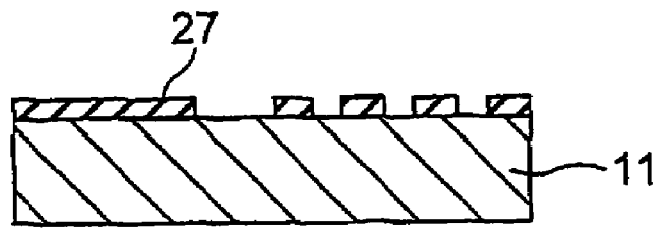
FIGS. 11A to 11E are partial sectional views showing steps of a process for fabricating a semiconductor device according to a modification of the second example of the method of the present invention.

As shown in FIG. 11A, a resist plate 27 is formed on the surface of the metal base 11 composed of a metal plate having a thickness in a range of 0.1 to 1.5 mm. The resist plate 27 may be formed by any technique such as spin coating, die coating, curtain coating, or printing, if it is fluid. Alternatively, resist plate 27 made of a dry film can be formed on the metal base 11 by a laminating method or the like. Thereafter, the resist plate 27 is cured by drying treatment or the like. A predetermined pattern is then formed in the resist plate 27 by a photolithographic process or the like. If the resist plate 27 is not photosensitive, such a pattern may be formed by a laser processing method or the like.

Figure 11B:
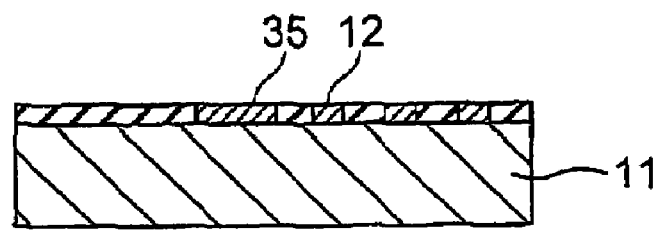

Next, as shown in FIG. 11B, a metal selected from the group consisting of gold, tin and solder or an alloy thereof is precipitated in the openings in the resist plate 27 by electrolytic plating or electroless plating to form surface layers of the metallic film 35 and the metal pads 12, after which nickel as barrier metal (not shown) and copper are consecutively precipitated to form the metallic film 35 and the metal pads 12. A barrier metal such as nickel may be precipitated prior to the formation of the metal pads 12 and the metallic film 35. This is conducted in order to prevent an intermetallic compound from being formed between the metal in the metal base 11 and the surface layers of the metal pads and the metallic film 35. Such a barrier metal should preferably be made of a metal which allows itself to be readily removed by etching.

In addition, if the surfaces of the metal pads 12 and the metallic film 35 should be retracted from the surface of the multilayer wiring film 15, the metal constituting the surfaces of the metal pads 12 and the metallic film 35 is precipitated after precipitation of nickel, for example, which is readily removed by etching, to a specified thickness, then nickel is precipitated as a barrier metal, and copper is finally precipitated to form the final structure of the metal pads 12 and the metallic film 35.

Figure 11C:
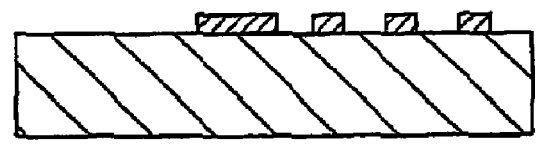

Thereafter, as shown in FIG. 11C, the resist plate 27 is removed, and the surface is thoroughly cleaned.

Figure 11D:
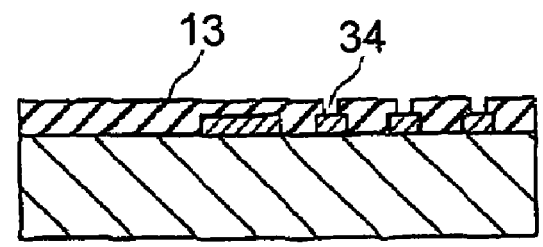

Next, an insulating layer 13 is formed as shown in FIG. 11D. Fluid insulating resin for the insulating layer 13 may be deposited by any of the spin coating, die coating, curtain coating, or printing methods. Alternatively, a dry film of insulating resin may be formed on the metal base 11 by a laminating method or the like. Thereafter, the insulating resin is cured by a drying treatment or the like.

Figure 11E:
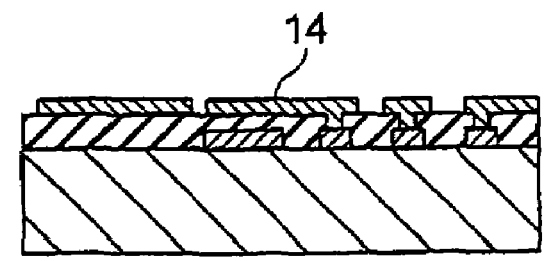

Next, the wiring layer 14 including a pattern of electrically conductive material is formed by any of the subtractive, semi-additive, or full-additive techniques as shown in FIG. 11E. Via holes 34 are filled with a conductive material for connecting the wiring layer 14 to the metal pads 12. If the metallic film 35 is to be used as an electric component in the electric circuit, via holes 34 are formed at desired positions at the step of FIG. 11D, followed by connecting the wiring layer 14 and the metallic film 35 together in the step of FIG. 10E.

Thus, the semiconductor device having the metallic film 35 according to the second embodiment previously described is efficiently manufactured by the above described fabrication process. According to the semiconductor device of the present embodiment, the metallic film 35 disposed for the central opening of the metal base 11 alleviates the stress applied to the multilayer wiring film 15, the stress being generated depending on presence or absence of the metal base 11. Thus, generation of cracks can be suppressed in the multilayer wiring film 15.

Next, a semiconductor device fabrication process according to a third example of the method of the present invention will be described. The method according to the third embodiment is used for manufacturing the semiconductor device according to the third embodiment of the present invention previously described, and shown in FIG. 3. The characteristic feature of the present embodiment is, compared to the method according to the first embodiment, that it has an additional process step for forming solder balls 20 on the surface of the metal pads 12 so as to protrude from the surface of the multilayer wiring film 15. FIGS. 12A to 12J are partial sectional views illustrating a semiconductor device fabrication process according to the third example of the method of the present invention. The views are arranged in the same order as the process steps. Although not illustrated, cleaning and thermal processing are performed as required after the process step prior to the next step.

Figure 12A:
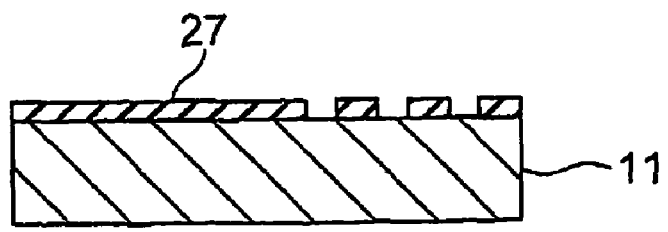
FIGS. 12A to 12J are partial sectional views consecutively showing steps of a process for fabricating a semiconductor device according to a third example of the method of the present invention.

First, a resist plate 27 is formed on the surface of the metal base 11 composed of a metal plate having a thickness in a range of 0.1 to 1.5 mm as shown in FIG. 12A. A resist plate 27 may be formed by any technique such as spin coating, die coating, curtain coating, or printing, if it is fluid. Alternatively, resist plate 27 made of a dry film can be formed on the metal base 11 by a laminating method or the like. Thereafter, the resist plate 27 is cured by drying treatment or the like. A predetermined pattern is then formed in the resist plate 27 by a photolithographic process or the like. If the resist plate 27 is not photosensitive, such a pattern may be formed by a laser processing method or the like.

Figure 12B:
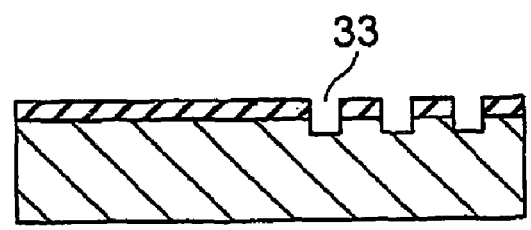

Next, as shown in FIG. 12B, half-etching is performed on the metal base 11 using the resist plate 27 as a mask, so as to form recesses 33 for the solder balls 20 and the metal pads 12.

Figure 12C:
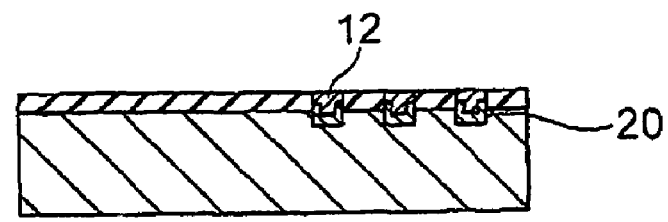

Next, as shown in FIG. 12C, the solder balls 20 are formed in the openings in the resist plate 27 by electrolytic plating or electroless plating, after which nickel as barrier metal (not shown) and copper are consecutively precipitated to form the metal pads 12. A barrier metal such as nickel may also be precipitated in the openings in the resist plate 27 prior to the formation of the surface layers of the solder balls 20. This is conducted in order to prevent an intermetallic compound from being formed between the metal base 11 and the solder balls 20. Such a barrier metal should preferably be made of a metal which allows itself to be readily removed by etching.

Figure 12D:
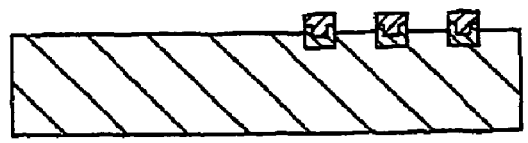

Thereafter, the resist plate 27 is removed as shown in FIG. 12D, and the surfaces of the metal base 11 and the metal pads 12 is thoroughly cleaned.

Figure 12E:
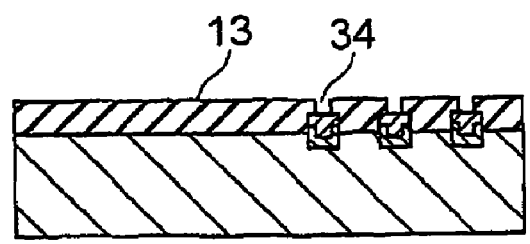

Next, the insulating layer 13 is formed as shown in FIG. 12E. Fluid insulating resin for the insulating layer 13 may be deposited by any of the spin coating, die coating, curtain coating, or printing methods. Alternatively, a dry film of insulating resin may be formed on the metal base 11 by a laminating method or the like. Thereafter, the insulating resin is cured by a drying treatment or the like. Predetermined patterns including the via holes 34 are then formed either by a photolithographic process or a laser processing method depending on whether the insulating resin is photosensitive or not. Finally, the insulating resin is cured to complete the insulating layer 13. The temperature for setting the insulating layer should be lower than the melting point of the solder balls 20.

Figure 12F:
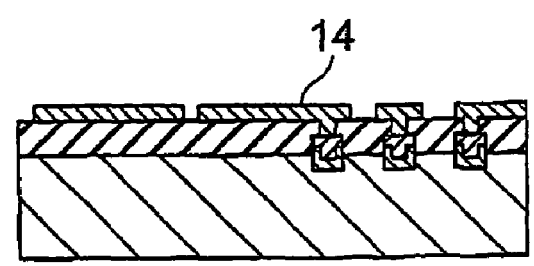

Next, the wiring layer 14 including a pattern of electrically conductive material is formed by any of the subtractive, semi-additive, or full-additive techniques as shown in FIG. 12F. Via holes 34 are filled with a conductive material for connecting the wiring layer 14 to the metal pads 12.

Figure 12G:
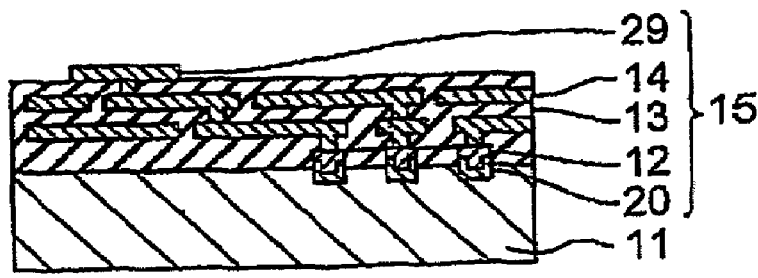
Figure 12H:
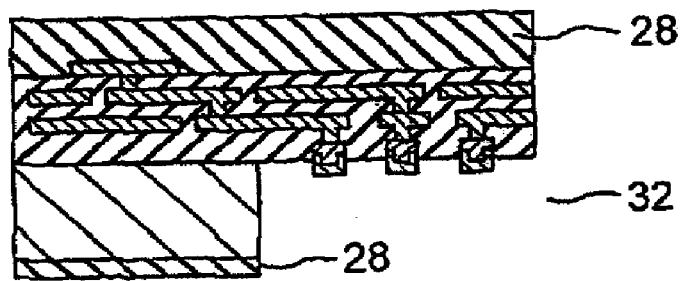
Figure 12:
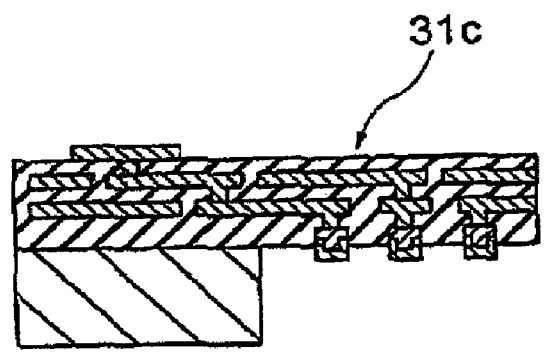

The process steps for forming the insulating layer 13 and the wiring layer 14 using any of the subtractive, semi-additive, or full-additive techniques are repeated for forming the multilayer wiring film 15, as shown in FIG. 12G Next, an etching resist 28 is formed on the rear surface of the multilayer wiring film 15 and on the front surface of the metal base 11 as shown in FIG. 12H. The etching resist 28 may be deposited by any of the spin coating, die coating, curtain coating, or printing methods if it is fluid, or by a laminating method if it is made of a dry film. Thereafter, the etching resist 28 is cured by a drying treatment or the like, and a predetermined pattern is formed therein either by a photolithographic process or a laser processing method depending on whether the etching resist 28 is photosensitive or not. The metal base 11 is then etched, using the etching resist 28 as a mask, until the multilayer wiring film 15 is exposed so as to form a recess 32.

The etching resist 28 is then removed as shown in FIG. 12I, and the surface of the metal pads 12 and the surface of the metal pads 29 are thoroughly cleaned. Thus the semiconductor package board 31b is obtained.

Figure 12J:
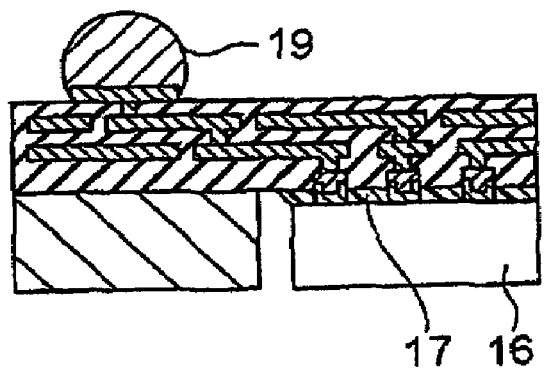

Next, the semiconductor chip 16 is flip-chip bonded to the metal pads 12 through the solder balls 20 as shown in FIG. 12J. Alternatively, this can be conducted through solder balls 18, using the solder balls 20 as supplemental solder. After the space between the multilayer wiring film 15 and the semiconductor chip 16 is filled with underfill 17, the underfill 17 is cured.

Finally, the BGA solder balls 19 are mounted on the metal pads 29, thereby completing the semiconductor device as shown in FIG. 12J.

The semiconductor devices having the solder balls 20 on the metal pads 12 according to the third embodiment of the present invention are efficiently manufactured by the above described fabrication process. According to the semiconductor device of the present embodiment, the solder balls 20 can function as the main or supplemental solder to flip-chip bond the semiconductor chip 16 to the multilayer wiring film 15, thereby enabling the flip chip pads to be formed at a fine-pitch. Also, the solder balls 18 of the semiconductor chip 16 can be dispensed with.

Next, a semiconductor device fabrication process according to a fourth example of the method of the present invention will be described. FIGS. 13A to 13J are partial sectional views illustrating a semiconductor device fabrication process according to the third example of the method of the present invention. The views are arranged in the same order as the process steps. Although not illustrated, cleaning and thermal processing are performed as required after the process step prior to the next step. The method according to the fourth example is used for manufacturing the semiconductor device according to the first embodiment or the second embodiment of the present invention previously described. The characteristic feature of the present example is, compared to the method according to the first example or second example, that it has the process step for forming, in advance, a recess in the metal base 11 for mounting the semiconductor chip therein.

Figure 13A:
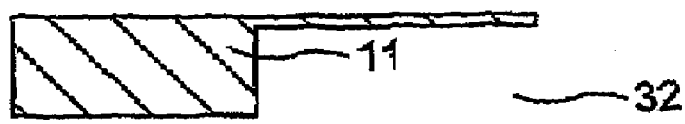
FIGS. 13A to 13J are partial sectional views consecutively showing steps of a process for fabricating a semiconductor device according to a fourth example of the method of the present invention.

First, a recess 32 for mounting a semiconductor chip therein is formed in the front surface of the metal base 11 composed of a metal plate having a thickness of 0.1 to 1.5 mm, as shown in FIG. 13A. This is achieved either by etching or a cutting process using a drill or the like. Alternatively, the metal base 11 may be composed of a planar metal plate and a metal plate having an opening at a position wherein a semiconductor chip is to be mounted. The planar metal plate and the metal plate are bonded together.

Figure 13B:
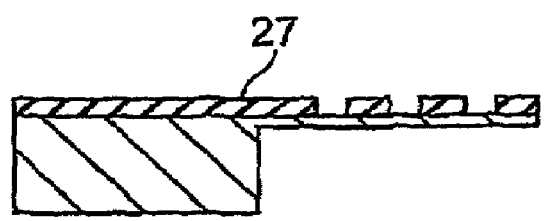

A resist plate 27 is then formed on the rear surface of the metal base 11 as shown in FIG. 13B. Resist plate 27 may be formed by any technique such as spin coating, die coating, curtain coating, or printing if it is fluid. Alternatively, resist plate 27 made of a dry film can be formed on the metal base 11 by a laminating method or the like. Thereafter, the resist plate 27 is cured by drying treatment or the like. A predetermined pattern is then formed in the resist plate 27 by a photolithographic process or the like. If the resist plate 27 is not photosensitive, such a pattern may be formed by a laser processing method or the like.

Figure 13C:
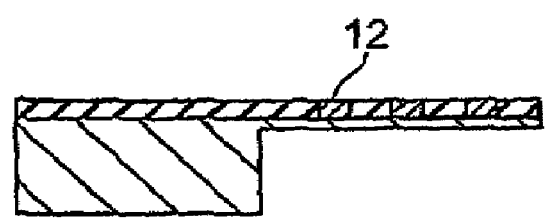

Next, as shown in FIG. 13C, at least one metal which is selected from the group consisting of gold, tin, and solder, or an alloy thereof is precipitated in the openings in the resist plate 27 by electrolytic plating or electroless plating. This is conducted so as to form the surface layers of the metal pads 12. Nickel as a barrier metal (not shown) and copper are consecutively precipitated to complete the metal pads 12. A barrier metal such as nickel may also be precipitated in the openings in the resist plate 27 prior to the formation of the surface layers of the metal pads 12. This is conducted in order to prevent an intermetallic compound from being formed between the metal base 11 and the surface layers of the metal pads 12. Such a barrier metal should preferably be made of a metal which allows itself to be readily removed by etching. If the surface of the metal pads 12 is desired to be retracted from the surface of the multilayer wiring film 15 in later process steps, metal such as nickel which is removable by etching is first precipitated to a predetermined thickness. This is followed by the precipitation of metals constituting the surface layers of the metal pads 12, nickel as barrier metal, and copper, to complete the metal pads 12.

Figure 13D:

Thereafter, the resist plate 27 is removed as shown in FIG. 13D, and the surface of the metal base 11 with the metal pads 12 is thoroughly cleaned.

Figure 13E:
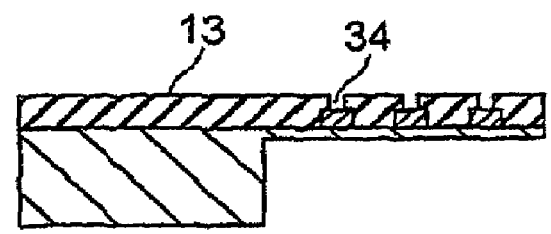

Next, the insulating layer 13 is formed as shown in FIG. 13E. Fluid insulating resin for the insulating layer 13 may be deposited by any of the spin coating, die coating, curtain coating, or printing methods. Alternatively, a dry film of insulating resin may be formed on the metal base 11 by a laminating method or the like. Thereafter, the insulating resin is cured by a drying treatment or the like. Predetermined patterns including the via holes 34 are then formed either by a photolithographic process or a laser processing method depending on whether the insulating resin is photosensitive or not. Finally, the insulating resin is cured to complete the insulating layer 13.

Figure 13F:
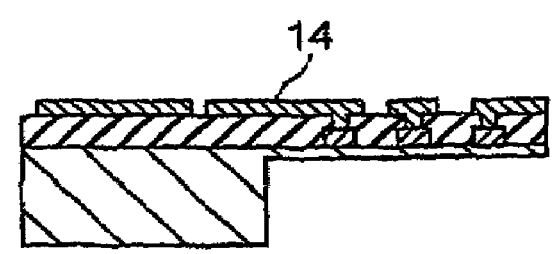

Next, the wiring layer 14 including a pattern of electrically conductive material is formed, as shown in FIG. 13F, by any of the subtractive, semi-additive, or full-additive techniques. Via holes 34 are filled with a conductive material for connecting the wiring layer 14 to the metal pads 12.

Figure 13G:
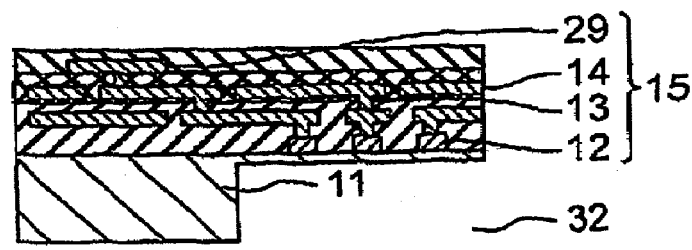

The process steps for forming the insulating layer 13 and the wiring layer 14 using any of the subtractive, semi-additive, or full-additive techniques are repeated for forming the multilayer wiring film 15 as shown in FIG. 13G.

Next, an etching resist 28 is formed in a predetermined pattern on the rear surface of the multilayer wiring film 15 and on the front surface of the metal base 11 as shown in FIG. 13B. The metal base 11 is then etched, using the etching resist 28 as a mask, until the multilayer wiring film 15 is exposed. If the thickness of the metal base 11 within the recess 32 for mounting the semiconductor chip therein is smaller than a predetermined value, it is possible to perform such etching without forming the etching resist 28.

The etching resist 28 is then removed as shown in FIG. 13I, and the surfaces of the metal pads 12 and the surfaces of the metal pads 29 are thoroughly cleaned. Thus the semiconductor package board 31a is obtained.

Figure 13H:
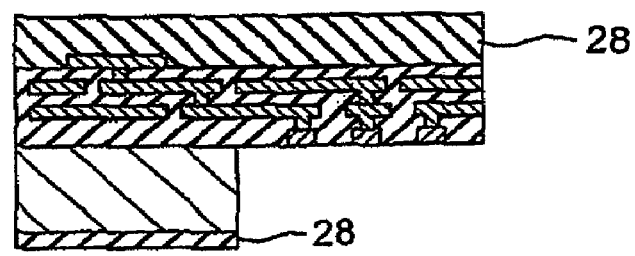
Figure 13:
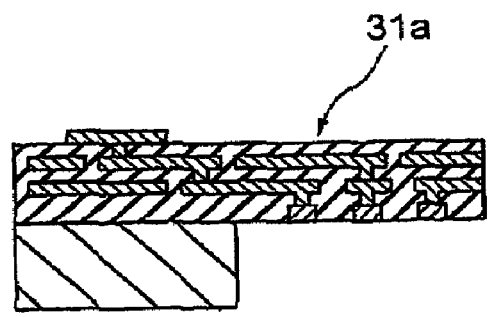
Figure 13J:
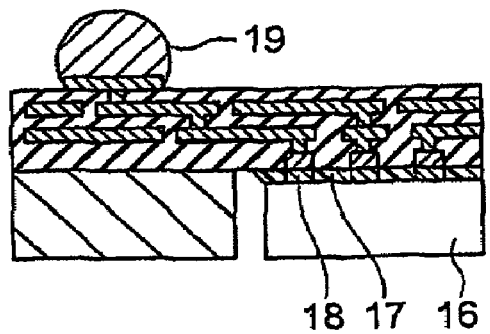

Next, the semiconductor chip 16 is flip-chip bonded to the metal pads 12 through the solder balls 18 as shown in FIG. 13J. After the space between the multilayer wiring film 15 and the semiconductor chip 16 is filled with underfill 17, the underfill 17 is cured. Finally, the BGA solder balls 19 are mounted on the metal pads 29, thereby completing the semiconductor device as shown in FIG. 13J.

The semiconductor device obtained by this method has a structure similar to the structure of the semiconductor device manufactured by the method according to the first or second embodiment previously described. According to the fabrication process of the third example of the method of the present invention, the etching time in the process step for etching the metal base 11 shown in FIG. 13H is reduced by providing the recess for mounting the semiconductor chip in the metal base 11 in advance. Also, in this way the openings in the metal base for mounting semiconductor chips therein can be formed uniformly.

Next, a semiconductor device fabrication process according to a fifth example of the method of the present invention will be described. The method of this fifth example is a combination of the advantages of the above-described third and the fourth examples. FIGS. 14A to 14J are partial sectional views illustrating a semiconductor device fabrication process according to the fifth embodiment of the present invention. The views are arranged in the same order as the process steps. Although not illustrated, cleaning and thermal processing are performed as required after the process step prior to the next step.

Figure 14A:
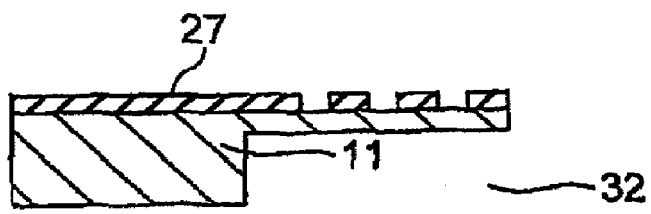
FIGS. 14A to 14J are partial sectional views consecutively showing steps of a process for fabricating a semiconductor device according to a fifth example of the method of the present invention.

First, a recess 32 for mounting a semiconductor chip therein is formed in the front surface of the metal base 11 composed of a metal plate having a thickness of 0.1 to 1.5 mm. This is achieved by any method previously described in the fabrication process of the third embodiment. A resist plate 27 is then formed on the rear surface of the metal base 11 as shown in FIG. 14A. Resist plate 27 may be formed by any technique such as spin coating, die coating, curtain coating, or printing if it is fluid. Alternatively, resist plate 27 made of a dry film can be formed on the metal base 11 by a laminating method or the like. Thereafter, the resist plate 27 is cured by a drying treatment or the like. A predetermined pattern is then formed in the resist plate 27 by a photolithographic process or the like. If the resist plate 27 is not photosensitive, such a pattern may be formed by a laser processing method or the like.

Figure 14B:
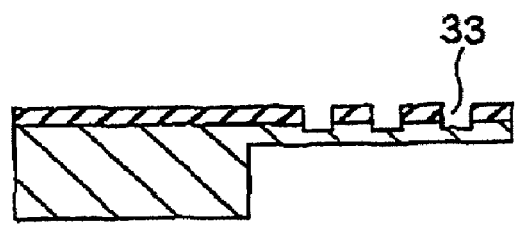

Next, as shown in FIG. 14B, half-etching is performed on the metal base 11 using the resist plate 27 as a mask. This is conducted so as to form recesses 33 for the solder balls 20 and the metal pads 12. In this fourth embodiment of the fabrication process, the recess 32 is formed in the metal base 11 prior to the formation of the recesses 33, but this order may be reversed. Of course, the recess 32 and the recesses 33 may be simultaneously formed in one step.

Figure 14C:
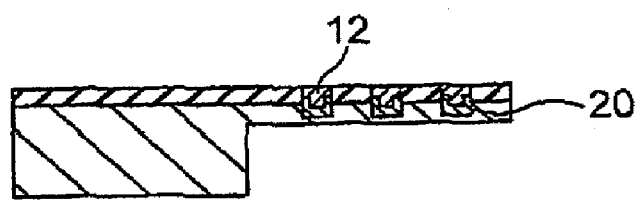

Next, as shown in FIG. 14C, solder balls 20 are formed in the openings in the resist plate 27 by electrolytic or electroless plating. After this nickel as barrier metal (not shown) and copper are consecutively precipitated to form the metal pads 12. A barrier metal such as nickel may also be precipitated in the openings in the resist plate 27 prior to the formation of the surface layers of the solder balls 20 in order to prevent an intermetallic compound from being formed between the metal base 11 and the solder balls 20. Such a barrier metal should preferably be made of a metal which allows itself to be readily removed by etching.

Figure 14D:

Thereafter, the resist plate 27 is removed as shown in FIG. 14D, and the surface of the metal base 11 with the metal pads 12 is thoroughly cleaned.

Figure 14E:
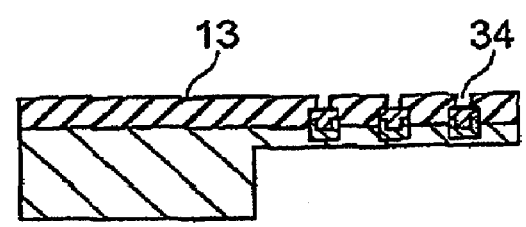

Next, the insulating layer 13 is formed as shown in FIG. 14E. Fluid insulating resin for the insulating layer 13 may be deposited by any of the spin coating, die coating, curtain coating, or printing methods. Alternatively, a dry film of insulating resin may be formed on the metal base 11 by a laminating method or the like. Thereafter, the insulating resin is cured by drying treatment or the like. Predetermined patterns including the via holes 34 are then formed either by a photolithographic process or a laser processing method depending on whether the insulating resin is photosensitive or not. Finally, the insulating resin is cured to complete the insulating layer 13. Here, the temperature for setting the insulating layer should be lower than the melting point of the solder balls 20.

Figure 14F:
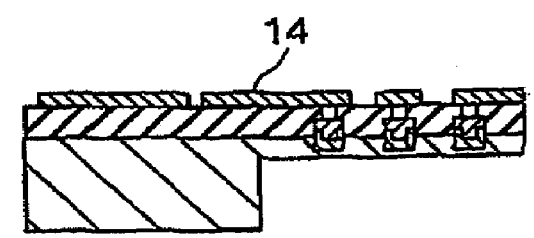

Next, the wiring layer 14 including a pattern of electrically conductive material is formed as shown in FIG. 14F by any of the subtractive, semi-additive, or full-additive techniques. Via holes 34 are filled with a conductive material for connecting the wiring layer 14 to the metal pads 12.

Figure 14G:
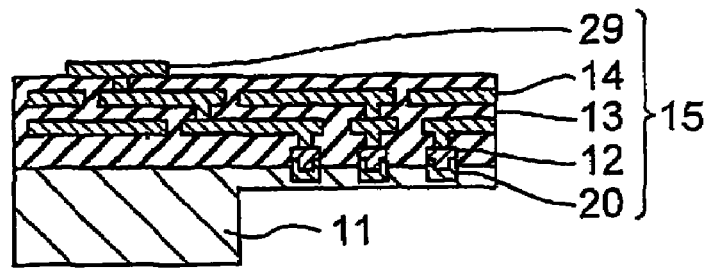
Figure 14H:
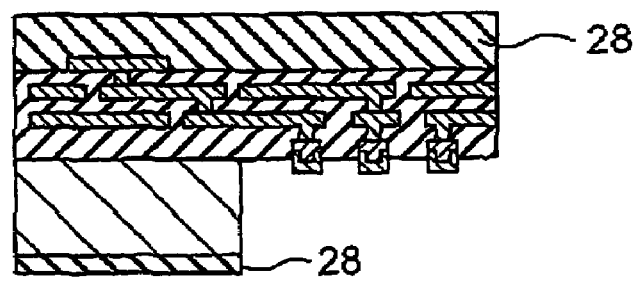

The process steps for forming the insulating layer 13 and the wiring layer 14 using any of the subtractive, semi-additive, or full-additive techniques are repeated for forming the multilayer wiring film 15 as shown in FIG. 14G Next, an etching resist 28 is formed in a predetermined pattern on the rear surface of the multilayer wiring film 15 and on the front surface of the metal base 11 as shown in FIG. 14H. The metal base 11 is then etched, using the etching resist 28 as a mask, until the multilayer wiring film 15 is exposed. If the thickness of the metal base 11 within the recess 32 for mounting the semiconductor chip therein is smaller than a predetermined value, it is possible to perform such etching without forming the etching resist 28.

Figure 14I:
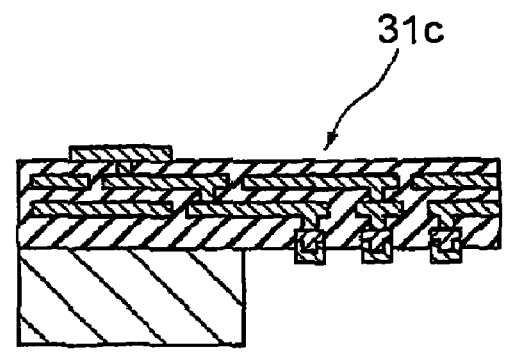

The etching resist 28 is then removed as shown in FIG. 14I, and the surface of the metal pads 12 and the surface of the metal pads 29 are thoroughly cleaned. Thus the semiconductor package board 31b is obtained.

Figure 14J:
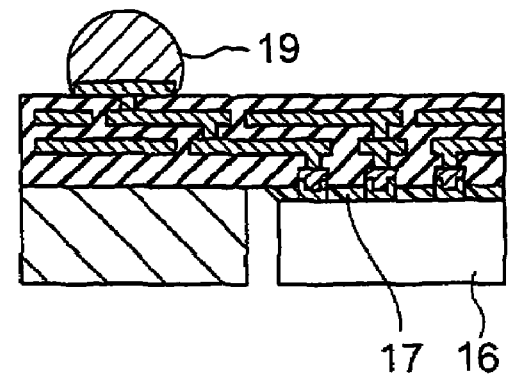

Next, the semiconductor chip 16 is flip-chip bonded to the metal pads 12 through the solder balls 20 as shown in FIG. 14J. Alternatively, this can be achieved through solder balls 18, using the solder balls 20 as supplemental solder. After this a gap between the multilayer wiring film 15 and the semiconductor chip 16 is filled with underfill 17, and the underfill 17 is cured.

Finally, the BGA solder balls 19 are mounted on the metal pads 29, thereby completing the semiconductor device as shown in FIG. 15D.

The semiconductor device obtained by this method has a structure similar to the structure of the semiconductor device manufactured by the method according to the third embodiment previously described. According to the fabrication process of the fifth example of the method of the present invention, the etching time in the process step for etching the metal base 11 is reduced by providing the recess 32 for mounting the semiconductor chip in the metal base 11 in advance. Also, in this way, the openings in the metal base for mounting semiconductor chips therein can be formed uniformly. Moreover, the solder balls 20 formed on the metal pads 12 can function as the main or supplemental solder for flip-chip bonding the semiconductor chip 16 to the multilayer wiring film 15, enabling the flip chip pads to be formed at a fine-pitch. Furthermore, solder balls 18 of the semiconductor chip 16 can be dispensed with.

Figure 15A:
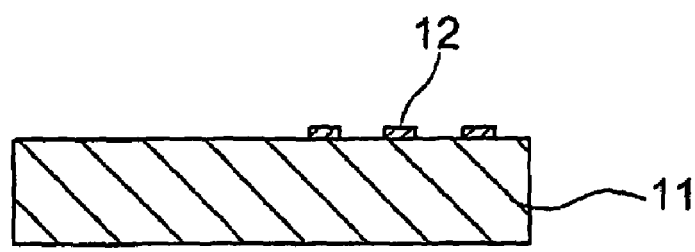
FIGS. 15A and 15B are partial sectional views consecutively showing steps of a process for fabricating a semiconductor device according to a sixth example of the method of the present invention.
Figure 15B:
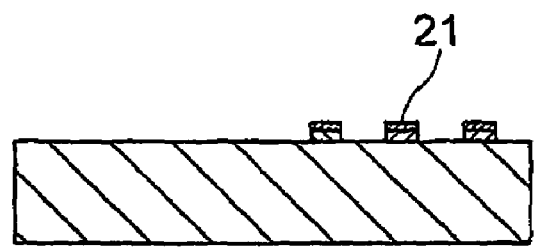

Next, a semiconductor device fabrication process according to a sixth example of the method of the present invention will be described. The method of this sixth embodiment is used for manufacturing the semiconductor device according to the fourth embodiment of the present invention described above, in which thin-film capacitors 21 are formed between the metal pads 12 and the wiring layer 14. FIGS. 15A and 15B are partial sectional views illustrating a semiconductor device fabrication process according to the sixth example of the method of the present invention. The views are arranged in the same order as the process steps. Although not illustrated, cleaning and thermal processing are performed as required after the process step prior to the next step.

First, a metal base 11 formed with metal pads 12 on the surface thereof is obtained by the process steps illustrated in FIGS. 9A through 9C. More specifically, a resist plate 27 is formed on the surface of the metal base 11 composed of a metal plate having a thickness in a range of 0.1 to 1.5 mm as shown in FIG. 9A.

Next, as shown in FIG. 9B, at least one metal which is selected from the group consisting of gold, tin, and solder, or an alloy thereof is precipitated in the openings in the resist plate 27 by electrolytic plating or electroless plating to form the surface layers of the metal pads 12. Nickel as a barrier metal and copper are consecutively precipitated to complete the metal pads 12.

Figure 16A:
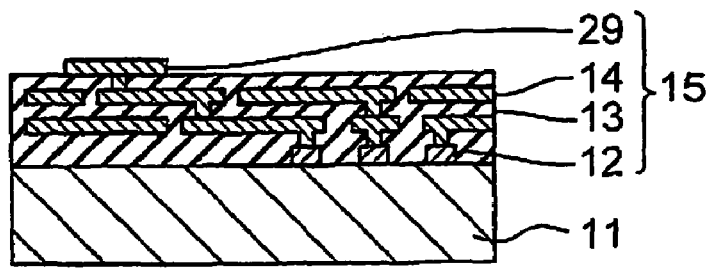
FIGS. 16A to 16G are partial sectional views consecutively showing steps of a process for fabricating a semiconductor device according to a seventh example of the method of the present invention.
Figure 16B:
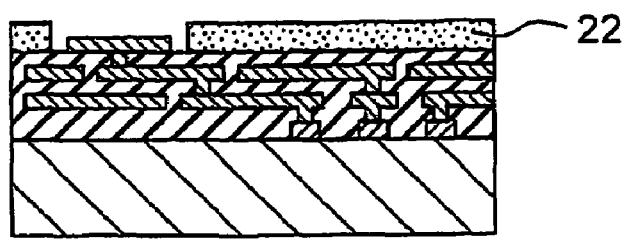
Figure 16C:
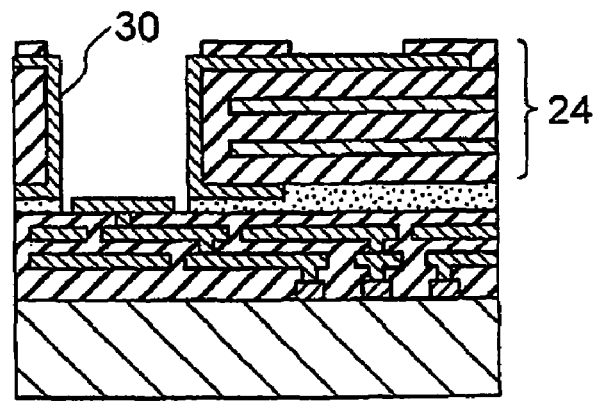
Figure 16D:
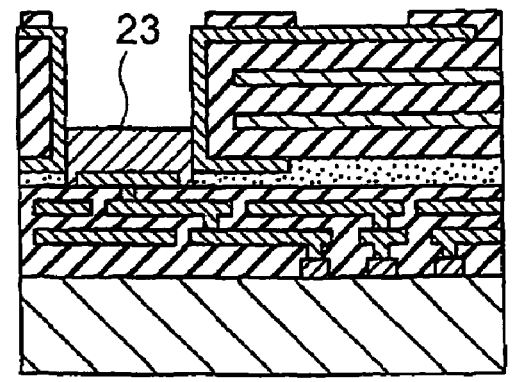

Thereafter, the resist plate 27 is removed as shown in FIG. 9C, and the surface of the metal base 11 with the metal pads 12 is cleaned to obtain the structure shown in FIG. 16A.

Instead of obtaining such a metal base 11 with the metal pads 12 formed thereon by the process steps illustrated in FIGS. 9A through 9C, a metal base 11 having the metal pads 12 and the solder balls 20 may be prepared by the process steps shown in FIGS. 10A through 10E or FIGS. 11A through 11C, or else, a metal base having the metal pads 12 and the solder balls 20 may be prepared by the process steps shown in FIGS. 12A through 12D. Alternatively, the metal base 11 may have a recess 32 for mounting a semiconductor chip therein on its front surface in addition to the metal pads 12 on its rear surface, by the process steps shown in FIGS. 13A through 13D. Another possibility is that the metal base 11 may have the recess 32 as well as both of the metal pads 12 and the solder balls 20, by the process steps illustrated in FIGS. 14A through 14D. It should be noted that in the case where the metal base 11 has the solder balls 20 therewith, the temperature at which the thin-film capacitors 21 are formed, to be described later, must be lower than the melting point of the solder balls 20.

The metal base 11 having at least the metal pads 12 thereon, as shown in FIG. 15A, is then subjected to film deposition processing such as sputtering, evaporation, CVD, and anodic oxidation, using a suitable resist pattern (not shown) as a mask such that only the surfaces of the desired metal pads 12 are exposed. Thus the thin-film capacitors 21 are formed as shown in FIG. 15B. The dielectric layer of these thin-film capacitors 21 is preferably composed of a compound material having a perovskite structure such as titanium oxide, tantalum oxide, $Al_2O_3$, $SiO_2$, $Nb_2O_5$, BST ($Ba_xSr_{1-x}TiO_3$), PZT ($PbZr_xTi_{1-x}O_3$), PLZT ($Pb_{1-y}La_yZr_xTi_{1-x}O_3$), and $SrBi_2Ta_2O_9$, where $0 \leq x \leq 1$ and $0 < y < 1$. Alternatively, the thin-film capacitors 21 may be composed of organic resin or the like with which a desired dielectric constant can be achieved.

Thereafter, unnecessary parts of the dielectric layer are removed by a lift off method wherein the resist is removed at the same time. In this step, the thin-film capacitors 21 can also be placed in desired positions by using a metal mask or the like.

The process steps illustrated in FIG. 9D through 9I are then performed sequentially. More specifically, an insulating layer 13 is formed as shown in FIG. 9D, on which a wiring layer 14 having a wiring pattern is formed as shown in FIG. 9E.

These processes for forming the insulating layer and the wiring layer are alternately iterated to form the multilayer wiring film 15 as shown in FIG. 9F.

Etching resist 28 is formed on the rear surface of the multilayer wiring film 15 and the front surface of the metal base 11 as shown in FIG. 9G, after which the metal base 11 is etched, using the etching resist 28 as a mask, until part of the multilayer wiring film 15 is exposed.

Then, as shown in FIG. 9H, the etching resist 28 is removed, and the surface of the metal pads 12 as well as that of the metal pads 29 are cleaned. Thus the semiconductor package board 31a is completed.

Finally, as shown in FIG. 9I, a semiconductor chip 16 is flip-chip bonded to the metal pads 12 through the solder balls 18, and the space between the multilayer wiring film 15 and the semiconductor chip 16 is filled with underfill 17, and the underfill 17 is cured. The BGA solder balls 19 are then mounted on the metal pads 29. Thus, a semiconductor device shown in FIG. 4 having thin-film capacitors 21 between the metal pads 12 and the insulating layer 13 is obtained.

In stead of the metal base 11 having metal pads 12 thereon and obtained by the process steps of FIGS. 9A to 9C, the metal base 11 may be used which has the metal pads and the metallic film 35 and is obtained by the process steps of FIGS. 10A through 10E or FIGS. 11A through 11C. In this case, after the thin-film capacitors 21 is formed, a semiconductor device having the metallic film 35 can be obtained by using the process steps of FIG. 10F through 10K or the process steps of FIGS. FIGS. 11D, 11E and FIGS. 10H through 10K.

In addition, the metal base 11 may be also used which has the metal pads 12 thereon and the recess 32 for mounting therein the semiconductor chip and is obtained by the process steps of FIGS. 13A to 13D. In this case, after the thin-film capacitors 21 is formed, the semiconductor device shown in FIG. 4 can be obtained by the process steps of FIGS. 13E through 13J. Moreover, the metal base 11 may be also used which has the metal pads 12 and the solder balls 20 as well as the recess 32 for mounting therein the semiconductor chip and is obtained by the process steps of FIGS. 14A to 14D. In this case, after the thin-film capacitors 21 is formed, the semiconductor device shown in FIG. 5 can be obtained by the process steps of FIGS. 14E to 14J.

Thus, a semiconductor device having a decoupling capacitor in close proximity to the semiconductor chip 16, wherein a thin-film capacitors 21 is formed between at least one metal pad 12 and the wiring layer 14, is manufactured by the fabrication process of the present example.

Next, a semiconductor device fabrication process according to a seventh example of the method of the present invention will be described. The method of this seventh example is used for manufacturing the semiconductor device according to the fifth embodiment of the present invention described above in which a printed circuit board 24 is bonded thereto as a carrier base. FIGS. 16A to 16G are partial sectional views illustrating a semiconductor device fabrication process according to the sixth embodiment of the present invention. The views are arranged in the same order as the process steps. Although not illustrated, cleaning and thermal processing are performed as required after the process step prior to the next step.

First, a stacked structure of interconnecting layers (hereafter referred to simply as a "stacked structure") as shown in FIG. 9F, in which the multilayer wiring film 15 is formed on the metal base 11 by the process steps shown in FIGS. 9A through 9F, is prepared.

Instead of a stacked structure having the multilayer wiring film 15 on the metal base 11 as shown in FIG. 9F, a stacked structure obtained by the method of the second embodiment shown in FIG. 10H or by the method of the third example shown in FIG. 12G, wherein solder balls 20 are provided, may be used. Alternatively, any of the stacked structures obtained by the methods of the fourth, fifth or sixth examples of the present invention may be used That is, the stacked structure may include a recess 32 for mounting a semiconductor chip therein as shown in FIG. 13G, or it may include such a recess 32 and the solder balls 20 as shown in FIG. 14G, or it may include thin-film capacitors 21.

The surface of the multilayer wiring film 15 is cleaned in the step shown in FIG. 13G, and adhesive 22 is applied onto the rear surface of the multilayer wiring film 15 in the regions other than the metal pads 29 as shown in FIG. 13H. The adhesive 22 can be applied in the desired regions by a printing method in which, for example, the metal pads 29 or any other regions on which no adhesive should be applied are masked when applying the adhesive 22, after which the mask is removed. Alternatively, if the adhesive 22 is made of a material having photosensitivity, it may be applied in a desired pattern by a photolithographic process.

Next, a printed circuit board 24 as a carrier base is bonded to the rear surface of the multilayer wiring film 15 such that the metal pads 29 of the film 15 are aligned with the through-holes 30 in the printed circuit board 24 as shown in FIG. 13I. It should be noted that the adhesive 22 may be applied on the printed circuit board 24 instead of on the rear surface of the multilayer wiring film 15 as in the example shown in FIG. 13H.

The through-holes 30 in the printed circuit board 24 are then filled with conductive paste 23 as shown in FIG. 17D, and cured by applying heat. If there is the risk that the conductive paste 23 may leak or deform in successive process steps, it is preferable that the through-holes 30 be additionally filled with insulating resin, and the insulating resin be cured.

Next, an etching resist 28 is formed on the surfaces of the printed circuit board 24, inner walls of the through-holes 30, and the metal base 11 as shown in FIG. 14A. The etching resist 28 may be formed by any technique such as spin coating, die coating, curtain coating, or printing if it is fluid, or by a laminating method if it is a dry film. Thereafter, the etching resist 28 is cured by a drying treatment or the like. A predetermined pattern is then formed in the etching resist by a photolithographic process or the like. If the etching resist 28 is not photosensitive, such a pattern may be formed by a laser processing method or the like. Thereafter, the metal base 11 is etched using this etching resist 28 as a mask until part of the multilayer wiring film 15 is exposed. In the case where the metal base 11 has a recess 32 for mounting the semiconductor chip therein, if the thickness of the metal base 11 within the recess 32 is smaller than a predetermined value, it is possible to perform such etching without forming the etching resist 28.

The etching resist 28 is then removed as shown in FIG. 14B, and the surface of the metal pads 12 and the surface of the metal pads on the printed circuit board 24 are thoroughly cleaned. Thus, the semiconductor package board 31d is obtained.

Next, a semiconductor chip 16 is flip-chip bonded to the metal pads 12 through the solder balls 18 as shown in FIG. 14C. If the solder balls 20 are provided on the surfaces of the metal pads 12, the semiconductor chip is flip-chip bonded via the solder balls 20 or via solder balls 18 by using the solder balls 20 as supplementary solder. After the space between the multilayer wiring film 15 and the semiconductor chip 16 is filled with underfill 17, the underfill 17 is cured. Finally, the BGA solder balls 19 are mounted on the metal pads of the printed circuit board 24.

As a modification of the above-described seventh example, the printed circuit board 24a described in the sixth embodiment of the semiconductor device of the present invention may be used. That is, the through-holes 30 may be fitted with connector pins 25 instead of mounting the BGA solder balls 19 on the metal pads, after the semiconductor chip 16 is flip-chip mounted on the metal pads 12.

Thus, the semiconductor device provided with a carrier base as shown in FIG. 6C or FIG. 7 can be efficiently manufactured according to the method of the present example.

Figure 17A:
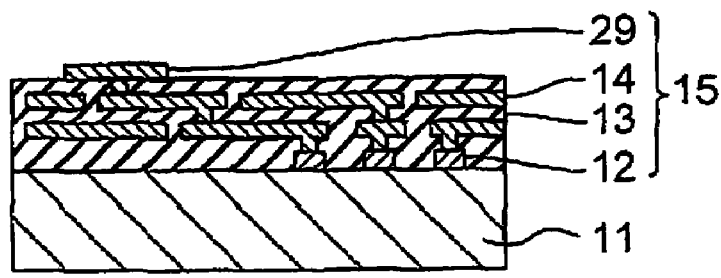
FIGS. 17A to 17C are partial sectional views consecutively showing steps of a process for fabricating a semiconductor device according to a eighth example of the method of the present invention.
Figure 17B:
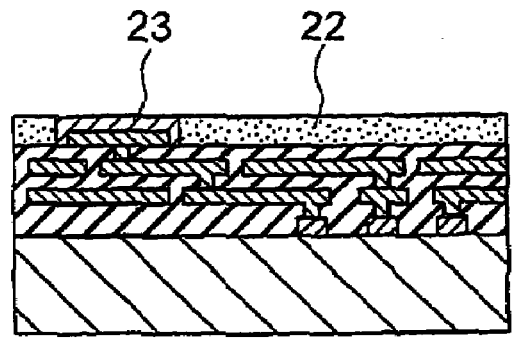
Figure 17C:
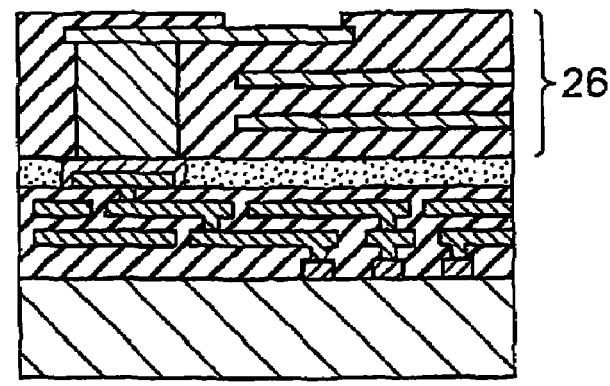

Next, a semiconductor device fabrication process according to a eighth embodiment of the present invention will be described. FIGS. 17A to 17C are partial sectional views illustrating a semiconductor device fabrication process according to the seventh embodiment of the present invention. The views are arranged in the same order as the process steps. The method of this seventh embodiment is used for manufacturing the semiconductor devices having a carrier base bonded thereto. Compared to the method of the sixth embodiment described above, the method of the seventh embodiment is characterized in that it uses a carrier base having via-holes filled with conductive material, or a carrier base provided with additional connection pads. The carrier base may be either a printed circuit board, a ceramic board, or an organic/inorganic composite board. Although not illustrated, cleaning and thermal processing are performed as required after the process step prior to the next step.

Similarly to the method of the seventh embodiment, a stacked structure of interconnecting layers in which the multilayer wiring film 15 is formed on the metal base 11 is first fabricated by the process steps shown in FIGS. 9A through 9F. A stacked structure as shown in FIG. 10H and having the metallic film 35 or a stacked structure as shown in FIG. 12G and having the solder balls 20, obtained by the method of the second or third example, may be used instead of the stacked structure shown in FIG. 9F. Alternatively, a stacked structure having a recess 32 for mounting a semiconductor chip therein as shown in FIG. 13G, obtained by the method of the fourth example, may be used. Another possibility is that the stacked structure may include the recess 32 as well as the solder balls 20 as shown in FIG. 14G, and described in the method of the fifth example, or it may include thin-film capacitors 21 as described in the method of the sixth example.

The surface of the multilayer wiring film 15 is cleaned in the step shown in FIG. 17A, and adhesive 22 is applied on the rear surface of the multilayer wiring film 15 in the regions other than the metal pads 29 as shown in FIG. 17B. The adhesive 22 is applied in the desired regions by any of the methods mentioned in the above-described sixth embodiment.

Next, a ceramic board 26 as a carrier base is bonded to the multilayer wiring film 15 such that the pads on the ceramic board 26 are connected to the pattern of conductive paste 23 as shown in FIG. 17C. In the present embodiment, as illustrated in FIG. 17C, in order to bond the ceramic board 26 to the multilayer wiring film 15, the front surface of the multilayer wiring film 15 is coated with the adhesive 22 and conductive paste 23. Both of these may of course be applied on the front surface of the ceramic board 26, or they may individually be provided on either one of the front surface of the multilayer wiring film 15 and the front surface of the ceramic board 26.

Figure 16E:
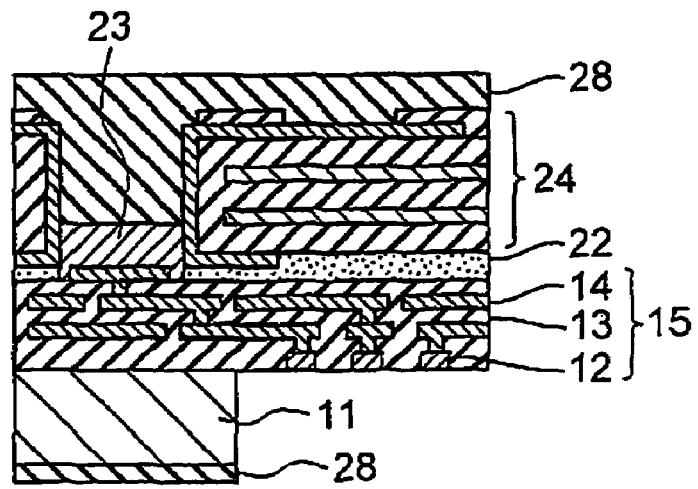
Figure 16F:
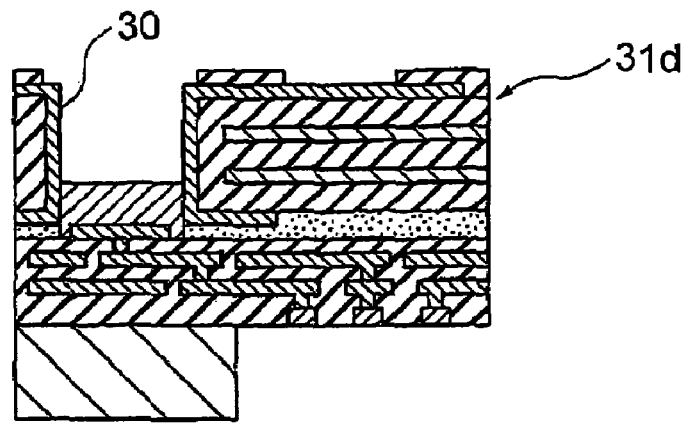
Figure 16G:
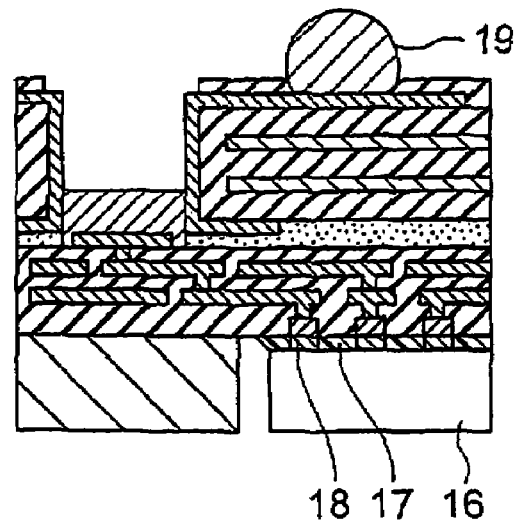

The process steps which are similar to those shown in FIGS. 16E to 16G are successively performed. That is, an etching resist 28 is formed on the surfaces of the ceramic board 26 and the metal base 11 in a predetermined pattern, after which the metal base 11 is etched using this etching resist 28 as a mask until part of the multilayer wiring film 15 is exposed. The etching resist 28 is then removed, and the surface of the metal pads 12 and the surface of the metal pads on the ceramic board 26 are thoroughly cleaned. Thus a semiconductor package board is obtained.

Next, a semiconductor chip 16 is flip-chip bonded to the metal pads 12 through the solder balls 18, after which a gap between the multilayer wiring film 15 and the semiconductor chip 16 is filled with underfill 17, and the underfill 17 is cured. Finally, the BGA solder balls 19 are mounted onto the metal pads of the ceramic board 26.

As one modification of the above-described eighth example, connector pins 25 may be mounted instead of the BGA solder balls 19, after the semiconductor chip 16 is flip-chip bonded to the metal pads 12.

Thus, according to the method of the seventh example, a semiconductor package board provided with a carrier base in which via-holes are filled with conductive material as shown in FIG. 7 or a carrier base having additional connection pads can be efficiently manufactured.

Next, a semiconductor device fabrication process according to a ninth example of the method of the present invention will be described. FIGS. 18A through 18E are partial sectional views illustrating a semiconductor device fabrication process according to the ninth example of the method of the present invention. The views are arranged in the same order as the process steps. The method of this ninth example is used for manufacturing the semiconductor device according to the fifth embodiment of the present invention described above, having a carrier base bonded thereto. The method of the present example is characterized in that an opening is first formed in the metal base 11 for receiving a semiconductor chip 16 therein before bonding the metal base 11 to the carrier base. Although not illustrated, cleaning and thermal processing are performed as required after the process step prior to the next step.

In the example illustrated in FIGS. 18A through 18E, a printed circuit board 24 is used for the carrier base similarly to the method of the seventh example. These drawings exemplarily show the process steps which are performed on the metal base 11 shown in FIG. 9H on which the multilayer wiring film 15 is stacked and in which an opening is formed. Instead of such a metal base, any of those shown in FIG. 10J, FIG. 12I, FIG. 13I or FIG. 14I, or the one having thin-film capacitors 21 obtained by the method of the sixth embodiment, may be used.

First, the metal base 11 having the multilayer wiring film 15 thereon and an opening therein is obtained by the process steps illustrated in FIGS. 9A through 9G. More specifically, a resist plate 27 is formed on the surface of the metal base 11 composed of a metal plate having a thickness in a range of 0.1 to 1.5 mm in a predetermined pattern, as shown in FIG. 9A.

Next, as shown in FIG. 9B, at least one metal which is selected from the group consisting of gold, tin, and solder, or an alloy thereof is precipitated in the openings in the resist plate 27 by electrolytic plating or electroless plating. This is followed by precipitation of nickel as a barrier metal and of copper, so as to form the metal pads 12.

Thereafter, the resist plate 27 is removed as shown in FIG. 9C, the surface of the metal base 11 with the metal pads 12 is cleaned, an insulating layer 13 is formed as shown in FIG. 9D, and a wiring layer 14 including a pattern of interconnections is formed as shown in FIG. 9E.

The processes required to form the insulating layer and the wiring layer are alternately iterated to form the multilayer wiring film 15, thereby obtaining a stacked structure as shown in FIG. 9F. Next, an etching resist 28 is formed on the rear surface of the multilayer wiring film 15 and the front surface of the metal base 11 as shown in FIG. 9G in a predetermined pattern, after which the metal base 11 is etched, using the etching resist 28 as a mask, until part of the multilayer wiring film 15 is exposed.

Figure 18A:
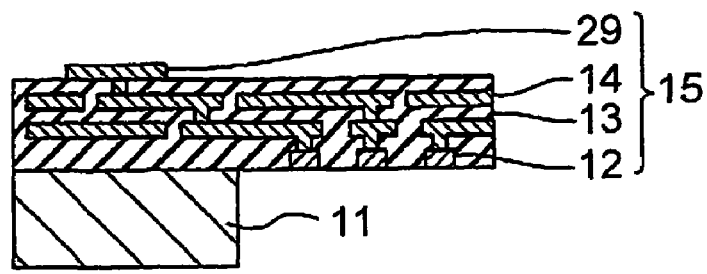
FIGS. 18A to 18E are partial sectional views consecutively showing steps of a process for fabricating a semiconductor device according to a ninth example of the method of the present invention.
Figure 18B:
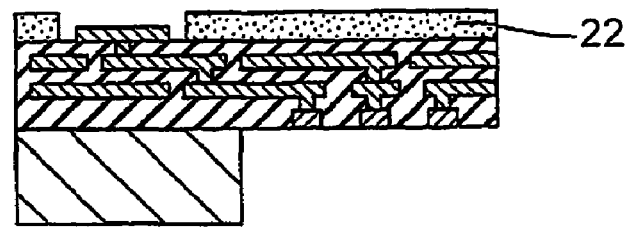

The surface of the multilayer wiring film 15 is cleaned in the step shown in FIG. 18A, and adhesive 22 is applied on the rear surface of the multilayer wiring film 15 in the regions other than the metal pads 29 as shown in FIG. 18B.

Figure 18C:
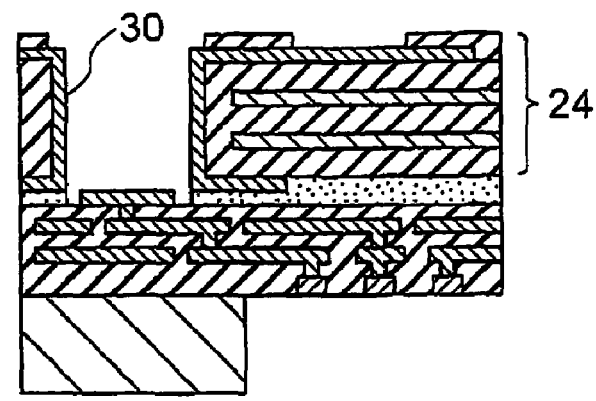

Next, a printed circuit board 24 as a carrier base is bonded to the multilayer wiring film 15 such that the metal pads 29 of the multilayer wiring film 15 are aligned with the through-holes 30 in the printed circuit board 24 as shown in FIG. 18C. In the present embodiment, as illustrated in FIG. 18B, the front surface of the multilayer wiring film 15 is coated with the adhesive 22. However, the adhesive 22 may be applied onto the printed circuit board 24 for the purpose of bonding.

Figure 18D:
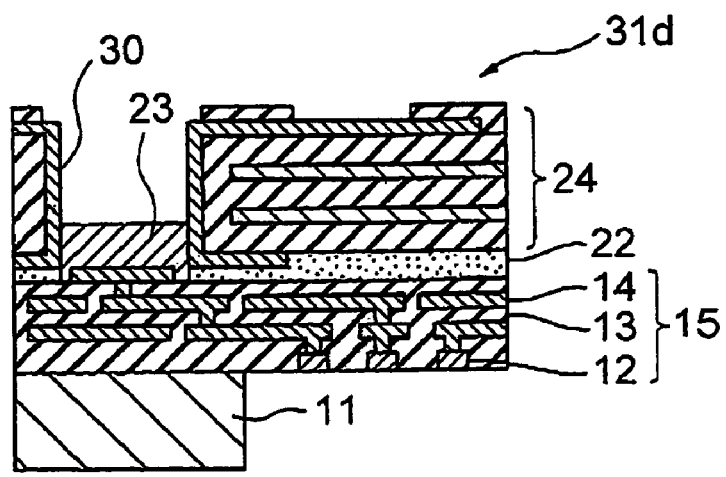
Figure 18E:
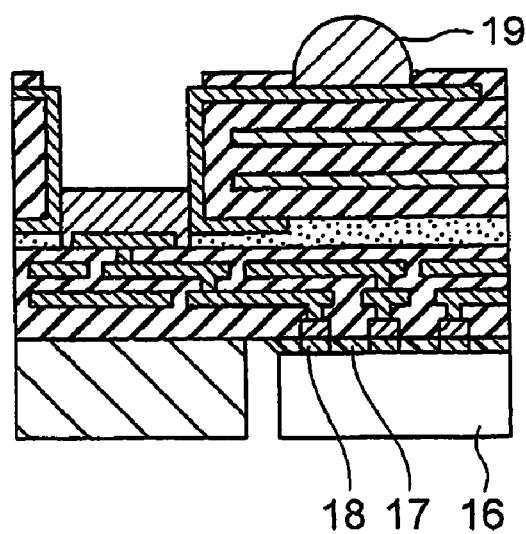

The through-holes 30 in the printed circuit board 24 are then filled with conductive paste 23 as shown in FIG. 18D, and the conductive paste 23 is cured by applying heat. If there is the risk that the conductive paste 23 may leak or deform in the succeeding process steps, it is preferable that the through-holes 30 be additionally filled with insulating resin, and the insulating resin be cured. Thus the semiconductor package board 31c as shown in FIG. 18D is obtained.

Figure 21A:
FIGS. 21A to 21H are partial sectional views consecutively showing steps of a process for fabricating a semiconductor device according to a twelfth example of the method of the present invention.
Figure 21B:
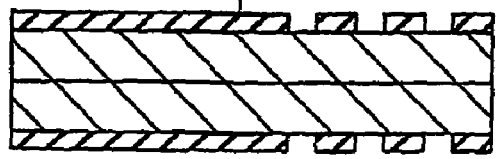

Next, a semiconductor chip 16 is flip-chip bonded to the metal pads 12 through the solder balls 18 as shown in FIG. 21B. If solder balls 20 are formed on the surface of the metal pads 12, the semiconductor chip 16 is flip-chip bonded via the solder balls 20, or via the solder balls 18 by using the solder balls 20 as a supplementary solder. Thereafter, the space between the multilayer wiring film 15 and the semiconductor chip 16 is filled with underfill 17, and the underfill 17 is cured. Finally, the BGA solder balls 19 are mounted onto the metal pads of the printed circuit board 24.

As a modification of the above-described method of the ninth example of the method of the present invention, the printed circuit board 24a described in the sixth embodiment of the semiconductor device of the present invention may be used. More specifically, the through-holes 30 may be fitted with the connector pins 25 instead of mounting the BGA solder balls 19 on the metal pads, after the semiconductor chip 16 is flip-chip bonded to the metal pads 12.

According to the fabrication process of the ninth example of the method of the present invention, an opening is formed in the metal base 11 for receiving a semiconductor chip 16 therein, before bonding a carrier base to the metal base 11. Therefore, the etching process of the metal base 11 after the bonding of the carrier base thereto is dispensed with. With respect to the bonding between the multilayer wiring film 15 and the carrier base, it is advantageous to use a method according to either the seventh or the eighth embodiments. On the other hand, the method according to the ninth embodiment is preferable if the carrier base consists of a material which is susceptible to damage by the etching process.

Figure 19A:
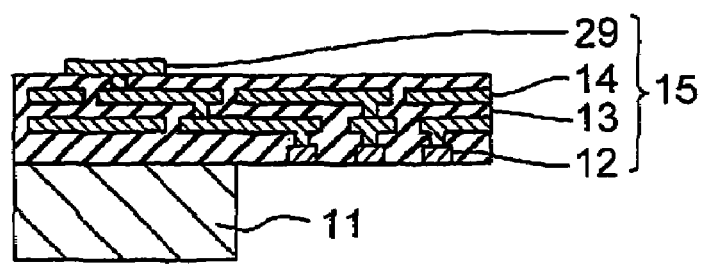
FIGS. 19A to 19C are partial sectional views consecutively showing steps of a process for fabricating a semiconductor device according to a tenth example of the method of the present invention.
Figure 19B:
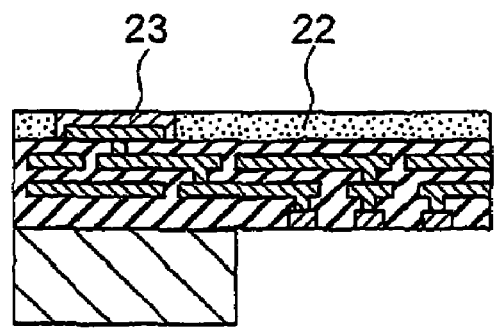
Figure 19C:
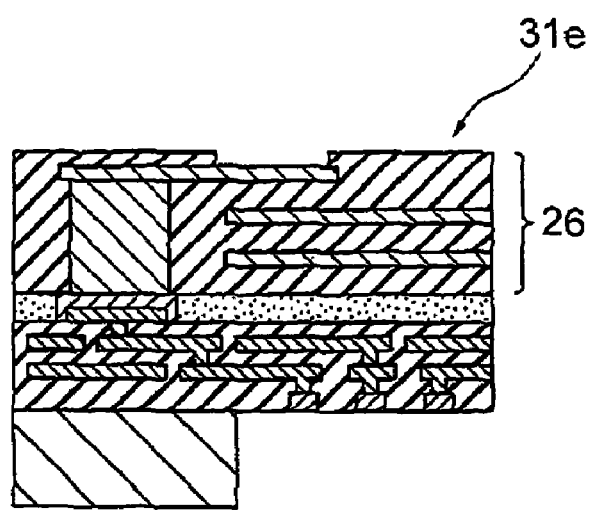

Next, a semiconductor device fabrication process according to a tenth example of the method of the present invention will be described. FIGS. 19A to 19C are partial sectional views illustrating a semiconductor device fabrication process according to the tenth example of the method of the present invention. The views are arranged in the same order as the process steps. This embodiment is a combination of the methods according to the above-described eighth example and the ninth example, and it is used for manufacturing the semiconductor package board having a carrier base bonded thereto. The method of the tenth example is characterized in that it uses a carrier base having via-holes filled with conductive material, or a carrier base provided with additional connection pads. Also, it is characterized in that an opening is first formed in the metal base 11 for receiving a semiconductor chip 16 therein before bonding the carrier base to the multilayer wiring film 15. The carrier base may be either a printed circuit board, a ceramic board, or an organic/inorganic composite board. Although not illustrated, cleaning and thermal processing are performed as required after the process step prior to the next step.

In the example illustrated in FIGS. 19A to 19C, a ceramic board is used for the carrier base. These drawings exemplarily show the process steps which are performed on the metal base 11 shown in FIG. 9H on which the multilayer wiring film 15 is formed. Instead of such a metal base, any of those shown in FIG. 10J, FIG. 12I, FIG. 13I or FIG. 14I, or the one having thin-film capacitors 21 obtained by the method of the sixth embodiment, may be used.

First, similarly to the method of the eighth example, the metal base 11 having the multilayer wiring film 15 thereon is obtained by the process steps illustrated in FIGS. 9A to 9G.

FIG. 19A shows the state after the etching resist 28 is removed. The surface of the multilayer wiring film 15 is cleaned, and adhesive 22 is applied onto the rear surface of the multilayer wiring film 15 in the regions other than the metal pads 29 as shown in FIG. 19B. Conductive paste 23 is then placed in the positions corresponding to the metal pads 29 located in the openings in the layer of adhesive 22. Alternatively, the conductive paste 23 may first be placed in desired the positions, after which the adhesive may be applied.

Next, a ceramic board 26 as a carrier base is bonded to the multilayer wiring film 15 such that the metal pads on the ceramic board 26 are connected to the pattern of conductive paste 23 as shown in FIG. 19C. In the present embodiment, as illustrated in FIG. 19B, in order to bond the ceramic board 26 to the multilayer wiring film 15, the front surface of the multilayer wiring film 15 is coated with the adhesive 22 and the conductive paste 23. Both of these may be applied on the front surface of the ceramic board 26, or they may individually be provided on either one of the front surface of the multilayer wiring film 15 and the front surface of the ceramic board 26. Thus a semiconductor package board 31d shown in FIG. 19C is obtained.

The process step thereafter is similar to that shown in FIG. 16G A semiconductor chip 16 is flip-chip bonded to the metal pads 12 through the solder balls 18, after which a gap between the multilayer wiring film 15 and the semiconductor chip 16 is filled with underfill 17, and the underfill 17 is cured. Finally, the BGA solder balls 19 are mounted onto the metal pads of the ceramic board 26.

As a modification of the above-described tenth embodiment, the printed circuit board 24a described in the sixth embodiment of the semiconductor device of the present invention may be used. That is, the through-holes 30 may be fitted with connector pins 25 instead of mounting the BGA solder balls 19 on the metal pads, after the semiconductor chip 16 is flip-chip mounted on the metal pads 12.

Thus, according to the method of the tenth embodiment, semiconductor package boards provided with a carrier base in which via-holes are filled with conductive material or a carrier base having additional connection pads can be efficiently manufactured. Moreover, since a recess is formed in the metal base 11 for receiving a semiconductor chip 16 therein before bonding a carrier base to the multilayer wiring film 15, the etching process of the metal base 11 after the bonding of the carrier base can be omitted. In this way, a carrier base which is susceptible to damage by the etching process can be used.

Next, a method according to an eleventh example of the method of the present invention will be described with reference to FIGS. 20A to 20J which consecutively show the process in sectional views of the semiconductor device. The steps shown in FIGS. 20H to 20J are similar to those shown in FIGS. 9F through 9I.

In the feature of the present example, both the surfaces of the metal base 11 are provided with the metal pads 12 and the multilayer wiring film 15, followed by separation of the metal base 11 to obtain a pair of package boards each having a second or front surface. This allows the throughput of the fabrication of the semiconductor package boards to double.

The process steps of FIGS. 20A to 20F are similar to those in the first example of the method of the present invention. Alternatively, the process steps in the second example shown in FIGS. 10A to 10G or FIGS. 11A to 11E, the process steps shown in FIGS. 10H to 10K, the process steps in the third example shown in FIGS. 12A to 12F, the process steps shown in FIGS. 12G to 12J, or the process steps in the sixth example using the thin-film capacitors 21 may be used instead. Between the steps, suitable cleaning and thermal processing steps may be used.

Figure 20A:
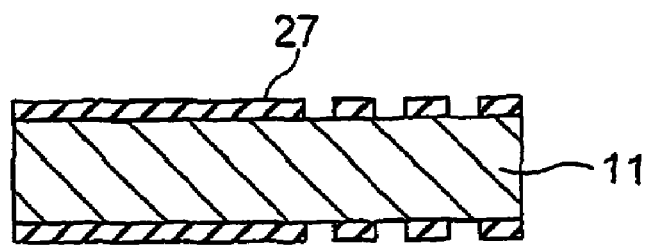
FIGS. 20A to 20J are partial sectional views consecutively showing steps of a process for fabricating a semiconductor device according to an eleventh example of the method of the present invention.

First, as shown in FIG. 20A, a resist plate 27 is formed on each of both the surfaces of the original metal base 11 made of metal plate. For obtaining a thickness of 0.1 to 1.5 mm for each of the metal base after the separation of the original metal base 11, the original metal base preferably has a thickness of 0.2 to 3.0 mm. A fluid resist plate 27 may be provided by any technique such as spin coating, die coating, curtain coating, or printing. If the resist plate 27 is made of a dry film, it can be formed on the metal base 11 by a laminating method or the like. Thereafter, the resist plate 27 is cured by a drying treatment or the like. A predetermined pattern is then formed in the resist plate 27 by a photolithographic process or the like. If the resist plate 27 is not photosensitive, such a pattern may be formed by a laser processing method or the like.

Figure 20B:
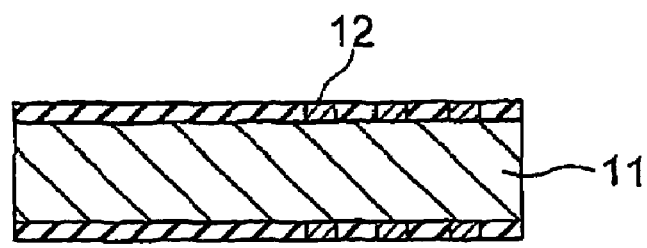

Subsequently, as shown in FIG. 20B, at least one metal selected from the group consisting of gold, tin and solder or an alloy thereof is precipitated in the openings in the resist plate 27 by using an electrolytic plating or electroless plating technique, thereby forming the surface layers of the first metal pads 12. Then, nickel as a barrier metal and copper are consecutively precipitated to form first metal pads 12. If it is considered that an intermetallic compound is formed between the metal in the metal pads 12 and the metal in the surface layers of the metal pads 12, nickel is precipitated as the barrier metal before the surface layers of the metal pads 12 are formed. In this case, the barrier metal is preferably made of a metal that can be readily removed by etching. In addition, if it is desired that the surface of the metal pads 12 be retracted from the surface of the multilayer wiring film 15 in the following steps such as shown in FIGS. 9F through 9I, a metal such as nickel that can be readily removed by etching is first precipitated to a specified thickness, followed by consecutive precipitation of the metal for the surface layers of the metal pads, nickel as a barrier metal and copper to form the metal pads 12.

Figure 20C:
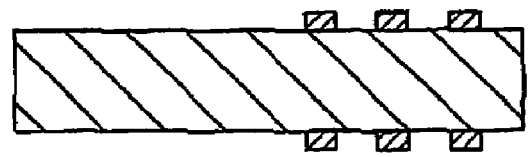

Then, the resist plate 27 is removed as shown in FIG. 20C, and the surface of the metal base 11 with the metal pads 12 is thoroughly cleaned.

Figure 20D:
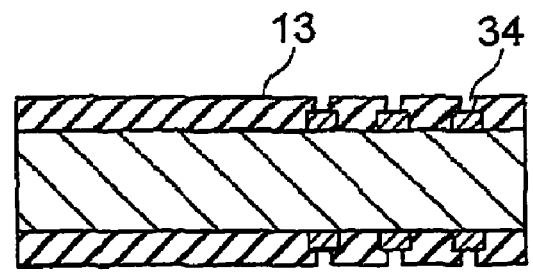

Next, the insulating layer 13 is formed on each of the surfaces of the original metal base 11, as shown in FIG. 20D. In this step, fluid insulating resin may be deposited by any of the spin coating, die coating, curtain coating, or printing methods. Alternatively, a dry film of insulating resin may be formed on the metal base 11 by a laminating method or the like. After that, the insulating resin is cured by drying treatment or the like. Predetermined patterns including the through holes 34 are then formed either by a photolithographic process or a laser processing method depending on whether the insulating resin is photosensitive or not. Finally, the insulating resin is cured to complete the insulating layer 13.

Figure 20E:
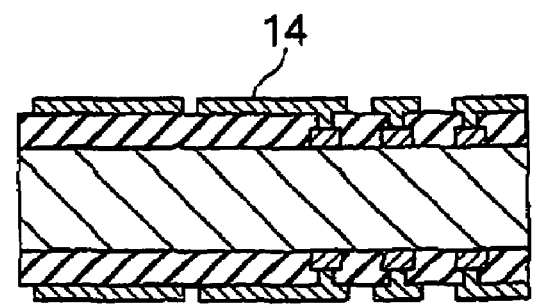

Next, as shown in FIG. 20E, the wiring layer 14 including a pattern of electrically conductive material is formed by any of the subtractive, semi-additive, or full-additive techniques on each of both the surfaces of the original metal base 11. The through holes 34 are filled with a conductive material for connecting the wiring layer 14 to the metal pads 12.

Figure 20F:
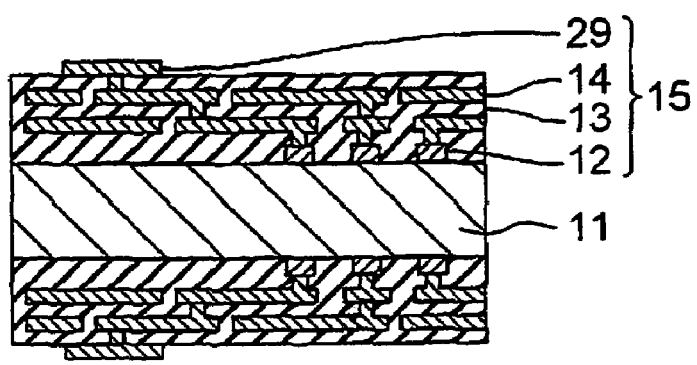

The process steps for forming the insulating layer 13 and the wiring layer 14 using any of the subtractive, semi-additive, or full-additive techniques are repeated for forming the multilayer wiring film 15 on each of both the surfaces of the original metal base 11 as shown in FIG. 20F.

Figure 20G:
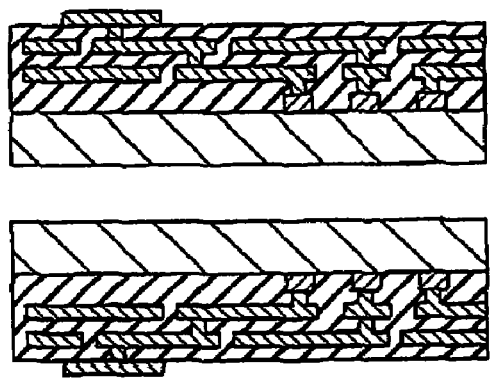
Figure 20H:
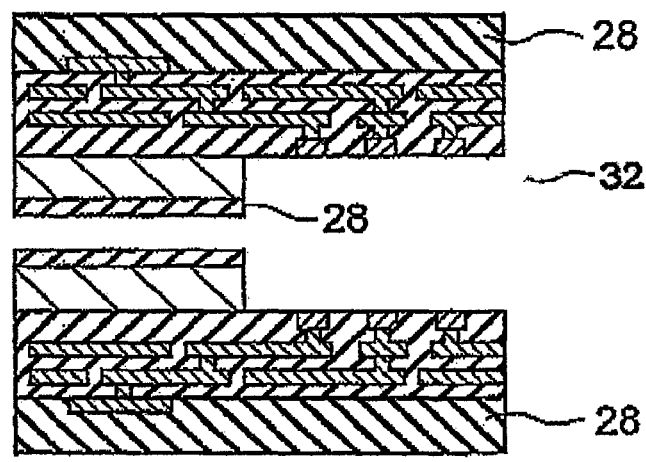
Figure 20:
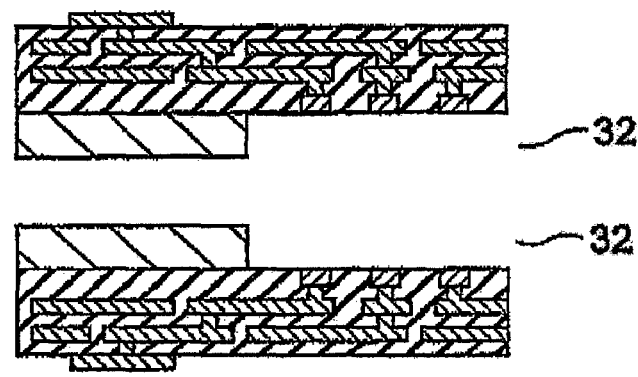
Figure 20J:
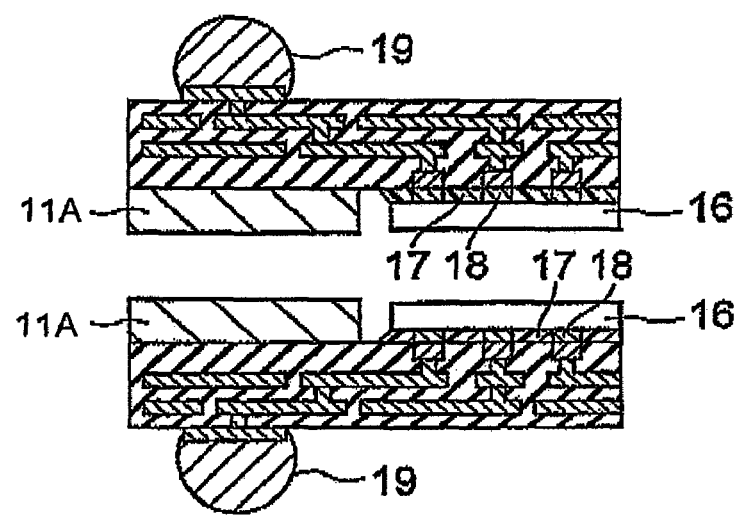

Next, as shown in FIG. 20G, the original metal base 11 is separated by using a slicing die or cutter at the center of the metal base 11 as viewed in the thickness direction thereof, thereby obtaining a pair of package boards.

The subsequent steps are shown in FIGS. 20H through 20J. More specifically, an etching resist 28 is formed on the rear surface of the multilayer wiring film 15 and the front surface of the separated metal base 11A, followed by etching the metal base 11 by using the etching resist 28 as a mask to form the recess 32 and to expose front surface of the multilayer wiring film 15. Then, the etching resist 28 is removed, the surface of the metal base with the multilayer wiring film 15 is cleaned, to obtain the structure of the semiconductor packaging board 31a of the present embodiment.

Subsequently, as shown in FIG. 20J, the semiconductor chip 16 is flip-chip bonded to the metal pads 12 via the solder balls 18, followed by filling the space between the multilayer wiring film 15 and the semiconductor chip 16 with underfill 17, and curing the same.

Thereafter, BGA solder balls 19 are mounted onto the metal pads 29, to obtain the semiconductor device shown in FIG. 20J.

It is to be noted that the semiconductor device bonded to the carrier base can be fabricated using the method according to the seventh example or eighth example. In this case, the carrier base may be bonded to the metal base after separation of the original metal base, or else the original metal base may be separated after the carrier bases are bonded to the multilayer wiring films formed on both the surfaces of the original metal base.

Next, a method according to a twelfth example of the method of the present invention will be described with reference to FIGS. 21A to 21H which consecutively show the process in sectional views of the semiconductor device. The steps following the step of FIG. 21H are similar to those shown in FIGS. 9F through 9I.

In the feature of the present example, a pair of metal bases are bonded together to form a bonded metal base, and both the surfaces of the bonded metal base are provided with the metal pads 12 and the multilayer wiring film 15, followed by separation of the bonded metal base 11 to obtain a pair of metal bases 11 each having a flat second surface. This allows the throughput of the fabrication of the semiconductor package boards to double.

The process steps of FIGS. 21A to 21F are similar to those in the first example of the method of the present invention. Alternatively, the process steps in the second example shown in FIGS. 10A to 10G or FIGS. 11A to 11E, the process steps shown in FIGS. 10H to 10K, the process steps in the third example shown in FIGS. 12A to 12F, the process steps shown in FIGS. 12G to 12J, or the process steps in the sixth example using the thin-film capacitors 21 may be used instead. Between the steps, suitable cleaning and thermal processing steps may be used.

First, as shown in FIG. 21A, a pair of metal bases 11 each made of a metal plate having a thickness of 0.1 to 1.5 mm are bonded together to form a bonded metal base. Each metal base may have a recess 32. The bonding may be conducted after forming ruggedness on the surfaces of the pair of metal bases 11 to be bonded together. Alternatively, the bonding may be achieved by using adhesive or welding at the entire surface or at the periphery thereof. It is preferable to bond the surfaces together at the periphery thereof in view of later separation.

Subsequently, as shown in FIG. 21B a resist plate 27 is formed on each of both the surfaces of the bonded metal base. A fluid resist plate 27 may be provided by any technique such as spin coating, die coating, curtain coating, or printing. If the resist plate 27 is made of a dry film, it can be formed on the metal base 11 by a laminating method or the like. Thereafter, the resist plate 27 is cured by a drying treatment or the like. A predetermined pattern is then formed in the resist plate 27 by a photolithographic process or the like. If the resist plate 27 is not photosensitive, such a pattern may be formed by a laser processing method or the like.

Figure 21C:
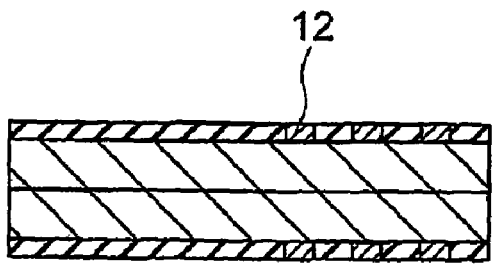

Subsequently, as shown in FIG. 21C, at least one metal selected from the group consisting of gold, tin and solder or an alloy thereof is precipitated in the openings in the resist plate 27 by using an electrolytic plating or electroless plating technique, thereby forming the surface layers of the first metal pads 12. Then, nickel as a barrier metal and copper are consecutively precipitated to form first metal pads 12. If it is considered that an intermetallic compound is formed between the metal in the metal pads 12 and the metal in the surface layers of the metal pads 12, nickel is precipitated as the barrier metal before the surface layers of the metal pads 12 are formed. In this case, the barrier metal is preferably made of a metal that can be readily removed by etching. In addition, if it is desired that the surface of the metal pads 12 be retracted from the surface of the multilayer wiring film 15 in the following steps such as shown in FIGS. 9F through 9I, a metal such as nickel that can be readily removed by etching is first precipitated to a specified thickness, followed by consecutive precipitation of the metal for the surface layers of the metal pads, nickel as a barrier metal and copper to form the metal pads 12.

Figure 21D:
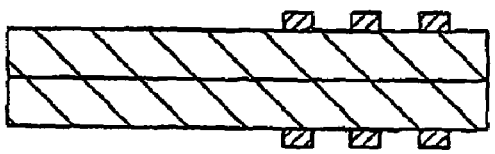

Then, the resist plate 27 is removed as shown in FIG. 21D, and the surface of the metal base 11 with the metal pads 12 is thoroughly cleaned.

Figure 21E:
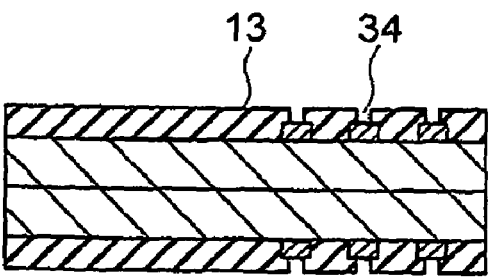

Next, the insulating layer 13 is formed on each of the surfaces of the bonded metal base, as shown in FIG. 21E. In this step, fluid insulating resin may be deposited by any of the spin coating, die coating, curtain coating, or printing methods. Alternatively, a dry film of insulating resin may be formed on the metal base 11 by a laminating method or the like. After that, the insulating resin is cured by drying treatment or the like. Predetermined patterns including the through holes 34 are then formed either by a photolithographic process or a laser processing method depending on whether the insulating resin is photosensitive or not. Finally, the insulating resin is cured to complete the insulating layer 13.

Figure 21F:
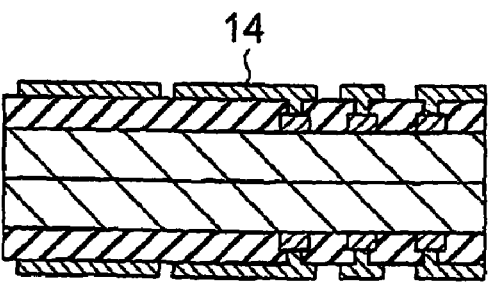

Next, as shown in FIG. 21F, the wiring layer 14 including a pattern of electrically conductive material is formed by any of the subtractive, semi-additive, or full-additive techniques on each of both the surfaces of the original metal base 11. The through holes 34 are filled with a conductive material for connecting the wiring layer 14 to the metal pads 12.

Figure 21G:
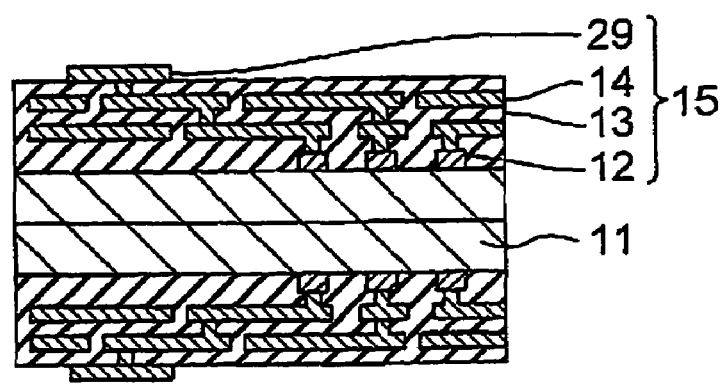
Figure 21H:
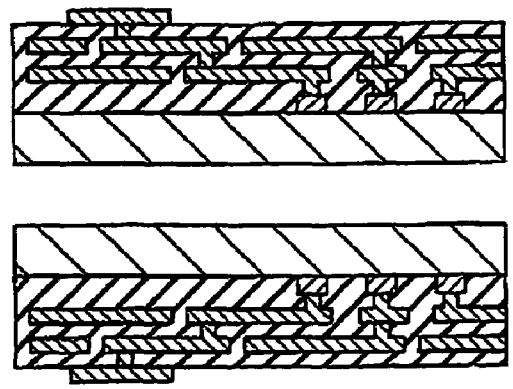

The process steps for forming the insulating layer 13 and the wiring layer 14 using any of the subtractive, semi-additive, or full-additive techniques are repeated for forming the multilayer wiring film 15 on each of both the surfaces of the bonded metal base as shown in FIG. 21G.

Next, as shown in FIG. 21H, the bonded metal base is separated by using a slicing die or cutter at the bonded surfaces, thereby obtaining a pair of package boards. If the bonding is conducted only at the periphery of the surfaces, the separation may be achieved by separating the peripheral area of the bonded surface from the central area thereof.

The subsequent steps are similar to the steps shown in FIGS. 9G through 9I. More specifically, an etching resist 28 is formed on the rear surface of the multilayer wiring film 15 and the front surface of the separated metal base 11A, followed by etching the metal base 11 by using the etching resist 28 as a mask to form the recess 32 and to expose front surface of the multilayer wiring film 15. Then, the etching resist 28 is removed, the surface of the metal base with the multilayer wiring film 15 is cleaned, to obtain the structure of the semiconductor packaging board 31*a* of the present embodiment.

Subsequently, as shown in FIG. 9I, the semiconductor chip 16 is flip-chip bonded to the metal pads 12 via the solder balls 18, followed by filling the space between the multilayer wiring film 15 and the semiconductor chip 16 with underfill, and curing the same.

Thereafter, BGA solder balls 19 are mounted onto the metal pads 29, to obtain the semiconductor device shown in FIG. 9I.

It is to be noted that the semiconductor device bonded to the carrier base can be fabricated using the method according to the seventh example or eighth example. In this case, the carrier base may be bonded to the metal base after separation of the bonded metal base, or else the bonded metal base may be separated after the carrier bases are bonded to the multilayer wiring films formed on both the surfaces of the bonded metal base.

As described above, in the semiconductor package board according to the above embodiments, the multilayer wiring film including first metal pads for mounting a semiconductor chip is stacked on a planar metal base, so that it has superior smoothness in the semiconductor chip mounting portion. As a result, the reliability in mounting a semiconductor chip onto a semiconductor package board is improved. The metal base encircling the semiconductor chip also helps prevent warping or dimensional changes of the multilayer wiring film, enabling the multilayer wiring film to have a large number of pins, resulting in its higher density and further miniaturization. The metal base is less deformable compared to a printed circuit board or ceramic board, thus facilitating the realization of a high density multilayer wiring board.

In the semiconductor device according to the above embodiments, the surface of the semiconductor chip mounted on the package board is disposed substantially coplanar with the surface of the metal base. Therefore, the metal base can be used as a stiffener, whereby a process step for mounting a stiffener to the board is dispensed with and a reduction in production cost is accordingly achieved.

Moreover, solder balls can be placed on the surface of the metal pads for mounting the semiconductor chip. The solder balls allow themselves to be used as solder for mounting the semiconductor chip or supplemental solder, as a result of which the fine-pitch of the pads for the flip-chip bonding can be increased.

Furthermore, according to the present invention, after forming the metal pads on the metal base for mounting a semiconductor chip thereon, thin-film capacitors can further be provided. Therefore, decoupling capacitors can be provided in close proximity to the flip-chip pads of the semiconductor chip.

In addition to the above, the present invention offers various other advantages as follows. In the semiconductor package board to which no carrier base is connected, the conductors are made with a minimum overall length, thereby offering advantages in higher speed signal transmission. With a carrier base, on the other hand, the device's function as a ground layer can readily be enhanced, and various passive components such as resistors and capacitors can also be added with ease. The carrier base also improves the reliability of the device in a secondary mounting operation, because it helps alleviate the stress generated when mounting the semiconductor package device onto a motherboard.

By forming multilayer wiring film on each of both the surfaces of the metal base, the throughput of the semiconductor device can be improved.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor package board, comprising:
    forming a plurality of first metal pads on a first surface and on a second surface of a metal base plate;
    forming a multilayer wiring film including a plurality of insulating layers and a plurality of wiring layers on said first surface and on said second surface of said metal base plate, said multilayer wiring film having a plurality of second metal pads on a top surface thereof, said plurality of second metal pads being electrically connected to respective said first metal pads through said wiring layers; separating said metal base plate into a first piece having said first surface and a second piece having said second surface; and etching said metal base plate from at least one of said first piece and said second piece to expose said first metal pads;
    wherein said metal base plate is made from a metal selected from the group consisting of stainless steel, iron, nickel, copper, and aluminum or an alloy thereof.

2. The method according to claim 1, wherein said first metal pads exposing operation comprises the operation of forming an opening in said metal base plate suited for receiving therein a semiconductor device.

3. The method according to claim 2, wherein said opening forming operation includes the operations of forming a resist exposing a portion of said exposing a portion of a surface of said first or second piece, etching said portion of said first or second piece by using said resist as mask to form said opening, and removing said resist.

4. The method according to claim 2, wherein the multilayer wiring film forming operation further comprises:
    forming a metallic film on said first surface of said metal base plate in a region other than regions where said first metal pads are disposed, said metallic film extending along a periphery of said opening after said opening forming operation; and
    plating said metal base plate by using a resist mask.

5. The method according to claim 2, further comprising the operation of forming a recess on a surface of said first piece in a region where said opening is to be formed, after said first metal pads forming operation.

6. The method according to claim 1, wherein said first metal pads forming operation includes the operations of forming a first resist mask having a plurality of openings, plating said metal base plate by using said first resist mask as a plating mask to form said first metal pads in said openings, and removing said first resist mask.

7. The method according to claim 6, wherein said first metal pads forming operation includes the operation of etching said metal base plate by using said first resist mask to form a plurality of recesses for receiving therein said first metal pads prior to said plating operation.

8. The method according to claim 6, wherein said first metal pads forming operation includes the operation of forming a plurality of solder balls in said openings prior to said plating operation.

9. The method according to claim 1, further comprising the operation of forming a thin-film capacitor on one of said first metal pads prior to said multilayer wiring film forming operation.

10. The method according to claim 1, wherein said multilayer wiring film forming operation includes the operations of forming an insulating layer, forming a plurality of via holes in said insulating layer corresponding to said first metal pads, forming alternately a plurality of wiring layers and a plurality of insulating layers, each of said wiring layers including a plurality of interconnections disposed corresponding to said via holes and insulator resin filled between said interconnections, and forming said second metal pads on an outermost surface of said multilayer wiring film.

11. The method according to claim 1, further comprising the operation of forming a plurality of solder balls .or connection pins on respective said second metal pads.

12. The method according to claim 1, further comprising the operation of bonding a carrier base onto a surface of said multilayer wiring film on a side opposite to a surface in contact with said metal base plate.

13. The method according to claim 12, wherein said carrier base is one of a printed circuit board, ceramic board, and organic/inorganic composite board, having at least one wiring layer.

14. The method according to claim 12, wherein said carrier base is bonded to said multilayer wiring film by using one of an adhesive, thermo-compression, and a chemical reaction.

15. The method according to claim 12, wherein said carrier base is electrically connected to said second metal pads using either conductive paste or an anisotropic conductive film.

16. The method according to claim 12, further comprising the operation of forming a plurality of either solder balls or connector pins on a surface of said carrier base so as to be electrically connected to said second metal pads through said carrier base.

17. The method according to claim 12, wherein said carrier base bonding operation is performed prior to said opening forming operation.

18. The method according to claim 12, wherein said carrier base bonding operation is performed after said opening forming step.

19. The method according to claim 12, further comprising the operation of connecting a semiconductor chip to said first metal pads.

* * * * *